United States Patent

Oguni et al.

[11] Patent Number: 6,106,997
[45] Date of Patent: Aug. 22, 2000

[54] PLATE FOR WATERLESS LITHOGRAPHIC

[75] Inventors: Masahiro Oguni, Tokyo; Ken Kawamura, Shiga; Keiko Sugikawa, Kusatsu, all of Japan

[73] Assignee: Toray Industries, Inc., Japan

[21] Appl. No.: 09/011,793

[22] PCT Filed: Jun. 17, 1997

[86] PCT No.: PCT/JP97/02085

§ 371 Date: Mar. 6, 1998

§ 102(e) Date: Mar. 6, 1998

[87] PCT Pub. No.: WO97/49005

PCT Pub. Date: Dec. 24, 1997

[30] Foreign Application Priority Data

| Jun. 17, 1996 | [JP] | Japan | 8-155581 |
| Oct. 11, 1996 | [JP] | Japan | 8-270106 |
| Apr. 11, 1997 | [JP] | Japan | 9-094035 |
| Jun. 5, 1997 | [JP] | Japan | 9-148340 |

[51] Int. Cl.$^7$ ................... G03F 7/11; G03F 7/30
[52] U.S. Cl. ................. 430/272.1; 430/273.1; 430/303; 430/302
[58] Field of Search .............. 430/302, 272.1, 430/273.1, 303

[56] References Cited

U.S. PATENT DOCUMENTS 5,464,686  11/1995  Higashi et al. ............... 430/272.1
5,571,658  11/1996  Sonokawa et al. ............ 430/302 X

FOREIGN PATENT DOCUMENTS 0 036 301   9/1981   European Pat. Off. .
42 24 938   2/1993   Germany .

OTHER PUBLICATIONS

Abe et al, Derwent–Acc No. 1993–046625, English Abstract of DE 4224938 A1, published Feb. 4, 1993, 2 pages.

*Primary Examiner*—Cynthia Hamilton
*Attorney, Agent, or Firm*—Austin R. Miller

[57] ABSTRACT

Provided is a non-processed plate for waterless lithographic printing plates, which comprises a photosensitive layer, an ink-repellent layer and a protective layer as laminated in that order on a support and in which the photosensitive layer contains a polymerizable compound as obtained by reacting a glycidyl ether of a polyalcohol, such as hexitol or pentitol, with acrylic acid and/or methacrylic acid. The plate has good image reproducibility and good storage stability. Processing the plate gives waterless lithographic printing plates having good printing durability.

24 Claims, No Drawings

PLATE FOR WATERLESS LITHOGRAPHIC

TECHNICAL FIELD

The present invention relates to non-processed plates for waterless lithographic printing plates, and more precisely, to those for waterless lithographic printing plates with good printing durability, image reproducibility and storage stability.

BACKGROUND ART

Known are waterless lithographic printing plates having an ink-repellent layer of silicone rubber or fluorine resin, for which various types of photosensitive plates have heretofore been proposed to be processed through selective exposure and development.

Waterless lithography is a type of lithographic printing method requiring no water for wetting printing plates in operation, in which, in the printing plate to be used, the image area of an ink-receiving layer and the non-image area of an ink-repellent layer are basically in nearly the same flat surface of the plate. In such waterless lithography, ink is adhered only to the image area of the printing plate owing to the difference in the ink affinity between those two layers, and the thus-adhered ink is then transferred onto printing substances such as paper. The non-image area is of an ink-repellent material such as fluorine resin, and no water is used in printing.

For example, for non-processed plates for waterless, positive lithographic printing plates, proposed were those comprising a photo-polymerizable photosensitive layer and an ink-repellent layer of silicone rubber as laminated on a support, for example, in JP-B Sho-54-26923 and Sho-56-23150; and those comprising a photo-dimerizable photosensitive layer and an ink-repellent layer of silicone rubber as laminated on a support, for example, in JP-B Hei-3-56622 and JP-A Sho-61-153655. For non-processed plates for waterless, negative lithographic printing plates, proposed were those comprising a photo-peelable photosensitive layer of a polyfunctional isocyanate-crosslinked, partial ester of phenol-formaldehyde novolak resin with 1,2-naphthoquinone-2-diazido-5-sulfonic acid chloride, and an ink-repellent layer of silicone rubber as laminated on a support in that order, for example, in JP-B Sho-61-54222.

Those non-processed plates are generally exposed to active rays through positive or negative film, and then developed, whereby only the ink-repellent layer corresponding to the image area is removed and the photosensitive layer and, as the case may be, the underlying primer layer or support are exposed out to be the ink-receiving image area.

For non-processed photosensitive plates for waterless lithographic printing plates having an ink-repellent layer of fluorine resin, disclosed are those having an ink-repellent layer of fluorine resin with 1H,1H,2H,2H-heptadecafluorodecyl methacrylate, for example, in JP-A Hei-2-254449 and Hei-2-85855.

Various photo-reactive compounds have heretofore been proposed to be usable in the photosensitive layers for non-processed plates for waterless, positive lithographic printing plates of the known ones noted hereinabove. For example, JP-B Sho-54-26923 and JP-A Hei-5-281717 disclose methods of using specific amino group-having monomers for producing non-processed plates for high-sensitivity waterless lithographic printing plates, but the disclosed methods are problematic in that the non-processed plates produced therein are often adversely affected by the basic amino groups and their image reproducibility is worsened while they are stored for a long period of time.

JP-A Hei-1-237663 and Hei-2-237663 disclose methods of using polymers having ethylenic unsaturated groups in their side chains, which, however, are problematic in that the non-processed plates produced therein do not have good image reproducibility since the polymerization efficiency of the ethylenic unsaturated groups in the polymers used is much lower as compared with that in monomers, and that the adhesiveness between the photosensitive layer and the overlying ink-repellent layer in the plates is poor. In order to solve these problems, they proposed a combination of amino-free, hydroxyl-having monomers and the polymers, which, however, was ineffective owing to the difference in the reaction speed between the ethylenic unsaturated groups in the side chains of the polymers and the monomers, but rather interfered with the polymerization reaction of the monomers with the polymers to worsen the image reproducibility of the plates. In addition, the proposed combination was ineffective in improving the image reproducibility of the plates as both the polymers and the monomers participate in the adhesion between the photosensitive layer and the overlying ink-repellent layer, and could not still improve the adhesiveness of the ink-repellent layer to the photosensitive layer.

Moreover, the conventional, waterless lithographic printing plates are problematic in that the photosensitive layers therein have, after having been exposed, too high initial elasticity, and are therefore broken at their adhesion interface in long-term printing, especially offset printing operation. In particular, in industrial-scale, waterless, rotary lithographic offset printing operation where repeated stress is imparted to the printing plate during ink transfer between the printing plate and the blanket, the conventional printing plates are often broken at the adhesion interface between the photosensitive layer and the ink-repellent layer and their printing durability is poor.

The present invention is to solve these drawbacks in the prior art, and its object is to provide non-processed plates for waterless lithographic printing plates with good storage stability, which are processed into waterless lithographic printing plates having good printing durability and which are characterized in that a photopolymerizable compound having a specific structure is incorporated into the photosensitive layer to improve the adhesiveness between the photosensitive layer and the overlying ink-repellent layer and that between the photosensitive layer and the underlying support or primer layer and to improve the polymerization efficiency of the photosensitive layer.

DISCLOSURE OF THE INVENTION

The present invention provides the following:

(1) A non-processed plate for waterless lithographic printing plates comprising at least a photosensitive layer and an ink-repellent layer as laminated in that order on a support, wherein said photosensitive layer contains a compound (A) having a structure of the following chemical formula (I-1):

(I-1)

wherein n represents an integer of from 2 to 5;
functional groups L may be the same or different and represent at least one selected from a hydroxyl group, a glycidyloxy group, an acryloxy group, a methacryloxy group, a 2-hydroxy-3-acryloxypropyloxy group and a 2-hydroxy-3-methacryloxypropyloxy group, and at least one L is a 2-hydroxy-3-acryloxypropyloxy group and/or a 2-hydroxy-3-methacryloxypropyloxy group;

(2) The non-processed plate for waterless lithographic printing plates of (1), wherein the compound (A) is one represented by the following chemical formula (I-2):

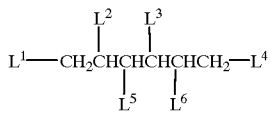

(I-2)

wherein $L^1$ to $L^6$ represent at least one selected from a hydroxyl group, a glycidyloxy group, an acryloxy group, a methacryloxy group, a 2-hydroxy-3-acryloxypropyloxy group and a 2-hydroxy-3-metlhacryloxypropyloxy group, and may be the same or different, provided that at least one of $L^1$ to $L^6$ is a 2-hydroxy-3-acryloxypropyloxy group and/or a 2-hydroxy-3-methacryloxypropyloxy group;

(3) The non-processed plate for waterless lithographic printing plates of (1) or (2), wherein the photosensitive layer contains a compound having a structure of the following chemical formula (II):

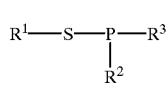

(II)

wherein $R^1$ to $R^3$ each independently represent at least one selected from a hydrogen atom, and a substituted or unsubstituted alkyl group having from 1 to 50 carbon atoms, a substituted or unsubstituted alkenyl group having from 2 to 50 carbon atoms and a substituted or unsubstituted aryl group having from 4 to 50 carbon atoms, which may optionally have any of ether bond, thioether bond, amino bond, oxo bond, ester bond, amido bond, carbonate bond, urethane bond and urea bond in their chains;

(4) The non-processed plate for waterless lithographic printing plates of (3), wherein the compound having the structure of formula (II) is one having a structure of the following chemical formula (III):

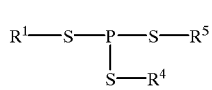

(III)

wherein $R^1$ has the same meaning as in formula (II); $R^4$ and $R^5$ each independently represent at least one selected from a hydrogen atom, and a substituted or unsubstituted alkyl group having from 1 to 50 carbon atoms, a substituted or unsubstituted alkenyl group having from 2 to 50 carbon atoms and a substituted or unsubstituted aryl group having from 4 to 50 carbon atoms, which may optionally have any of ether bond, thioether bond, amino bond, oxo bond, ester bond, amido bond, carbonate bond, urethane bond and urea bond in their chains;

(5) The non-processed plate for waterless lithographic printing plates of any one of (1) to (4), wherein the compound (A) is one obtained by reacting hexitol-polyglycidyl ether with acrylic acid and/or methacrylic acid;

(6) The non-processed plate for waterless lithographic printing plates of (5), wherein hexitol-polyglycidyl ether is one obtained by reacting 1 mol of hexitol with from 1 to 6 mols of epihalohydrin;

(7) The non-processed plate for waterless lithographic printing plates of any one of (1) to (4), wherein the compound (A) is one obtained by reacting 1 mol of hexitol with from 1 to 6 mols of epihalohydrin and further with from 3 to 4 mols of acrylic acid and/or methacrylic acid;

(8) The non-processed plate for waterless lithographic printing plates of any one of (1) to (4), wherein the compound (A) is one obtained by reacting 1 mol of hexitol with from 3 to 4 mols of epihalohydrin and further with from 1 to 6 mols of acrylic acid and/or methacrylic acid;

(9) The non-processed plate for waterless lithographic printing plates of any one of (1) to (4), wherein the compound (A) is one obtained by reacting 1 mol of hexitol with from 3 to 4 mols of epihalohydrin and further with from 3 to 4 mols of acrylic acid and/or methacrylic acid;

(10) The non-processed plate for waterless lithographic printing plates of any one of (5) to (9), wherein hexitol is sorbitol;

(11) The non-processed plate for waterless lithographic printing plates of any one of (1) to (10), wherein the photosensitive layer contains a binder polymer;

(12) The non-processed plate for waterless lithographic printing plates of (11), wherein the ratio of the compound (A) to the binder polymer is from 100/10 to 100/8,000 by weight;

(13) The non-processed plate for waterless lithographic printing plates of any one of (1) to (12), wherein the photosensitive layer contains an amino group-having monomer;

(14) The non-processed plate for waterless lithographic printing plates of any one of (1) to (13), wherein a protective layer is further laminated over the ink-repellent layer;

(15) The non-processed plate for waterless lithographic printing plates of (14), wherein the protective layer contains a photo-fading substance;

(16) The non-processed plate for waterless lithographic printing plates of (15), wherein the photo-fading substance in the protective layer is at least one of disperse dyes, cationic dyes, reactive dyes, quinonediazide compounds and diazo compounds;

(17) The non-processed plate for waterless lithographic printing plates of (14), wherein the protective layer contains a photo-coloring substance;

(18) The non-processed plate for waterless lithographic printing plates of (17), wherein the photo-coloring substance in the protective layer is a photochromic compound;

(19) The non-processed plate for waterless lithographic printing plates of any one of (14) to (18), wherein the protective layer contains grains having, as measured in the Coulter counter method, a mean grain size of from 4 to 9µ and a refractive index of from 1.4 to 1.7;

(20) The non-processed plate for waterless lithographic printing plates of any one of (1) to (19), wherein the ink-repellent layer is a silicone rubber layer;

(21) The non-processed plate for waterless lithographic printing plates of (20), wherein the ink-repellent layer comprises silicone rubber as obtained through condensation reaction;

(22) The non-processed plate for waterless lithographic printing plates of (20), wherein the ink-repellent layer comprises silicone rubber as obtained through addition reaction;

(23) The non-processed plate for waterless lithographic printing plates of any one of (1) to (22), wherein a primer layer is interposed between the support and the photosensitive layer; and

(24) A method for producing a waterless lithographic printing plate, comprising exposing and developing the non-processed plate of any one of (1) to (22).

BEST MODES OF CARRYING OUT THE INVENTION

The constitution of the invention is described more concretely hereinunder.

The support to be used in the invention may be any and every one used in ordinary, waterless lithographic printing plates, or proposed for use in the plates. That is, usable herein is any and every support having flexibility enough to be set in ordinary lithographic printers and resisting the load to be applied thereto in printing operation.

For example, as the support for use in the invention, mentioned are metal plates of aluminium, copper, zinc, steel, etc.; metal plates coated with chromium, zinc, copper, nickel, aluminium, iron or the like through plating or vapor deposition; plastic films or sheets of polyesters such as polyethylene terephthalate, polyethylene naphthalate, etc., or of polyethylene, polystyrene, polypropylene, etc.; supports with rubber elasticity of chloroprene rubber, NBR, etc.; and paper lined with such a rubber-like elastic support, paper, resin-coated paper or metal foil of aluminium or the like.

Of those, preferred are metal plates and plastic films, especially preferred is metal plates consisting essentially of aluminium. Those metal plates are directly used, or are used after having been cleaned, for example, through degreasing with aqueous alkaline or acidic solutions. If desired, they may be sand-grained through mechanical processing, electrolytic etching or the like. The mechanical processing includes, for example, pole polishing, brushing, liquid honing and buffing. For the electrolytic etching, for example, used is a solution containing phosphoric acid, sulfuric acid, hydrochloric acid, nitric acid or the like. One or more of those methods may be applied to the metal plates, optionally combined with one or more other surface-processing methods.

In the non-processed plates for waterless lithographic printing plates of the invention, the adhesion between the support and the photosensitive layer is very important for the basic properties of the plates such as their image reproducibility and printing durability. Preferably, therefore, a primer layer is formed on the support, prior to forming the photosensitive layer thereon, to thereby ensure sufficient adhesiveness between the photosensitive layer and the support. That is, in the preferred structure, a primer layer is interposed between the support and the photosensitive layer. The interposition of the primer layer therebetween is preferred also for anti-halation and dyeability of the plates.

The primer layer includes, for example, one as formed by exposing a photosensitive polymer to cure it, such as that proposed in JP-A Sho-60-22903; one as formed by exposing a methacrylic phosphorus-containing monomer to cure it, such as that proposed in JP-A Hei-4-322181; one as formed by exposing a methacrylic epoxy compound to cure it, such as that proposed in JP-A Hei-2-7049; one as formed by thermally curing an epoxy resin, such as that proposed in JP-A Sho-62-50760; one as formed by curing gelatin, such as that proposed in JP-A Sho-63-133151; and one comprising an urethane resin, such as that proposed in JP-A Hei-1-282270. Apart from these, usable are cured films of urea resins, phenolic resins, melamine resins, benzoguanamineresins, phenoxyresins, diazoresins, cellulose and its derivatives, chitin, chitosan, milk casein, soybean protein, albumin, etc. Any others than those are also usable.

To soften the primer layer, polymer and copolymers having a glass transition point (Tg) of not higher than 20° C., preferably not higher than 0° C. may be added thereto. The glass transition point, Tg, is referred to for indicating the physical properties of amorphous polymer materials, and is a transition point (temperature) at which an amorphous polymer material of being in a vitreous condition changes to be in a rubber-like condition, and vice versa. To obtain its glass transition point, in general, a sample is gradually heated with measuring its volume, using a dilatometer, and the point at which the inclination of the specific volume-temperature curve as obtained by plotting the data suddenly varies is read. The thus-read point is the glass transition point of the sample.

As examples of polymers and copolymers having such a glass transition point (Tg) of not higher than 20° C., mentioned are the following, of which the details will be referred to hereinunder for the photosensitive layer. However, these are not limitative.

(1) Vinyl polymers
 (a) Polyolefins
 (b) Polystyrenes
 (c) (Meth)acrylate polymers
(2) Non-vulcanized rubbers
(3) Polyoxides (polyethers)
(4) Polyesters
(5) Polyurethanes
(6) Polyamides The amount of the polymer and copolymer having a glass transition point (Tg) of not higher than room temperature to be added to the primer layer is not specifically defined, so far as it is within the scope capable of forming a film. As the case may be, the polymer and copolymer only may form the primer layer. If desired, a suitable amount of a crosslinking agent may be added to the primer layer in order to improve the film-forming ability of the polymer and copolymer. The crosslinking agent usable herein includes, for example, polyfunctional isocyanates and polyfunctional epoxy compounds. If further desired, suitable amounts of other additives may be added to the primer layer, including, for example, dyes, pH indicators, photosensitive printing-out agents (that is, compounds capable of coloring through exposure), photochromic compounds, photo-polymerization initiators, adhesion promoters, pigments, inorganic grains of silica, etc., and surfactants. A suitable amount of catalyst for crosslinking may also be added to the primer layer.

The amounts of the components constituting the primer layer are not specifically defined. Preferably, however, the primer layer comprises 100 parts by weight of one or more of polymers or copolymers such as those mentioned above, and photo-polymerizable or thermally-polymerizable compositions, optionally from 0 to 100 parts by weight of a suitable crosslinking agent, optionally from 0 to 100 parts by weight of additives such as dyes, pigments, photochromic compounds, adhesion promoters and surfactants, and optionally from 0 to 10 parts by weight of a known catalyst.

The thickness of the primer layer may be from 0.1 to 100 μm, preferably from 0.2 to 50 μm, more preferably from 0.5 to 20 μm. Too thin primer layers are unfavorable as they often have pin holes and other defects after coated. Too thick primer layers are uneconomical.

The photosensitive layer constituting the plates of the invention is described hereinunder.

The photosensitive layer is characterized in that it contains a compound (A) having the structure of the following chemical formula (I-1):

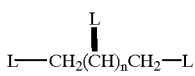

(I-1)

wherein n represents an integer of from 2 to 5;
functional groups L may be the same or different and represent at least one selected from a hydroxyl group, a glycidyloxy group, an acryloxy group, a methacryloxy group, a 2-hydroxy-3-acryloxypropyloxy group and a 2-hydroxy-3-methacryloxypropyloxy group, and at least one L is a 2-hydroxy-3-acryloxypropyloxy group and/or a 2-hydroxy-3-methacryloxypropyloxy group.

The compound is produced from a material, pentitol or hexitol, by converting a part or all of the hydroxyl groups of the material into glycidyloxy groups, followed by reacting the thus-converted material with acrylic acid or methacrylic acid to thereby convert a part or all of the glycidyloxy groups of the material into 2-hydroxy-3-acryloxypropyloxy groups or 2-hydroxy-3-methacryloxypropyloxy groups. Optionally, the hydroxyl groups still existing in the material without being converted into glycidyloxy groups are reacted with acrylic acid or methacrylic acid to convert them into acryloxy groups or methacryloxy groups. Preferably, the compound is such that the functional groups of 2-hydroxy-3-acryloxypropyloxy group, 2-hydroxy-3-methacryloxypropyloxy group, acryloxy group and/or methacryloxy group existing in one molecule or the compound is not smaller than 3 mols in total, as being effective in improving the printing properties of the plate.

Pentitol is a generic term including isomers, and it may be of any structure of D-arabitol, L-arabitol, xylitol and adnitol. Those compounds may be obtained by reducing pentose.

Similarly, hexitol is a generic term including isomers, and it may be of any structure. Preferred is sorbitol, as the material for producing it is easily available. Those compounds may be obtained by reducing a monose, hexose.

More preferred are compounds of formula (I-1) where n is 4, or that is, hexitol-derived comchemic of the following chemical formula (I-2):

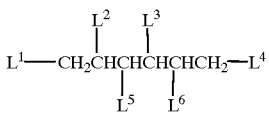

(I-2)

wherein $L^1$ to $L^6$ represent at least one selected from a hydroxyl group, a glycidyloxy group, an acryloxy group, a methacryloxy group, a 2-hydroxy-3-acryloxypropyloxy group and a 2-hydroxy-3-methacryloxypropyloxy group, and may be the same or different, provided that at least one of $L^1$ to $L^6$ is a 2-hydroxy-3-acryloxypropyloxy group and/or a 2-hydroxy-3-methacryloxypropyloxy group;

In formula (I-1), n is an integer of from 2 to 5, but preferably from 3 to. More preferably, n is 3 or 4, since the material for the compound of the type is easily available.

In general, the compound having the structure of formula (I-1) is prepared by reacting hexitol-polyglycidyl ether, pentitol-polyglycidyl ether or tetritol-polyglycidyl ether with acrylic acid and/or methacrylic acid.

As shown below, hexitol is a compound having 6 carbon atoms in its back-bone. Pentitol differs from hexitol in that the number of the carbon atoms constituting the intermediate part of its back-bone is smaller by one. Tetritol differs from pentitol in that the number of the carbon atoms constituting the intermediate part of its back-bone is smaller by one.

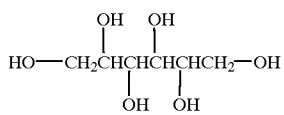

Accordingly, hexitol-polyglycidyl ether is a compound to be represented by the following formula. Pentitol-polyglycidyl ether differs from hexitol-polyglycidyl ether in that the number of the carbon atoms constituting its back-bone is smaller by one.

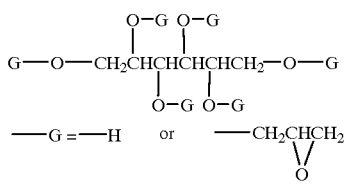

wherein at least one G is a glycidyl group.

Hexitol-polyglycidyl ether illustrated above, such as sorbitol-polyglycidyl ether, is obtained by reacting 1 mol of hexitol such as sorbitol with from 1 to 6 mols of epihalohydrin. Epihalohydrin includes, for example, epichlorohydrin, epibromohydrin and epiiodohydrin.

In reacting hexitol-polyglycidyl ether such as sorbitol-polyglycidyl ether with acrylic acid and/or methacrylic acid, the epoxy group of hexitol-polyglycidyl ether reacts with acrylic acid and/or methacrylic acid in the following manner.

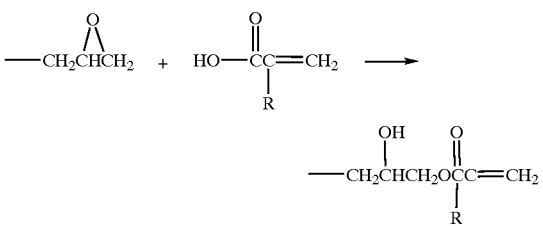

wherein R represents a hydrogen atom or a methyl group.

Reaction of pentitol-polyglycidyl ether with acrylic acid and/or methacrylic acid is the same as above, except that the number of the carbon atoms constituting the back-bone is smaller by one.

For example, a compound mentioned below is obtained by reacting 1 mol of hexitol with epihalohydrin to give 6 mols of epoxy group, and further with methacrylic acid and/or acrylic acid.

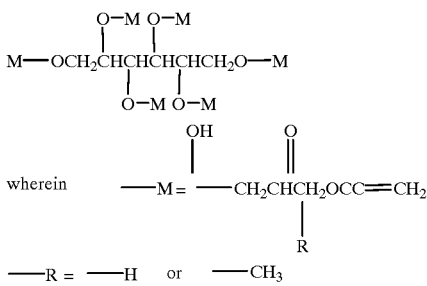

Where hexitol-polyglycidyl ether or pentitol-polyglycidyl ether contains non-reacted hydroxyl groups, the hydroxyl groups may still be therein as they are, but may be esterified with acrylic acid and/or methacrylic acid.

Hexitol-polyglycidyl ether such as sorbitol-polyglycidyl ether has at most 6 groups/molecule capable of reacting with a carboxylic acid. In this, therefore, one mol of the hexitol moiety may be reacted with acrylic acid and/or methacrylic acid to thereby introduce from 1 to 6 mols of the polymerizable group into the resulting product. Pentitol-polyglycidyl ether has at most 5 groups/molecule capable of reacting with a carboxylic acid. In this, therefore, one mol of the pentitol moiety may be reacted with acrylic acid and/or methacrylic acid to thereby introduce from 1 to 5 mols of the polymerizable group into the resulting product.

Of the compounds mentioned above, especially preferred are those to be obtained by reacting 1 mol of hexitol with epihalohydrin to introduce from 1 to 6 mols of epoxy group into the product, and further with acrylic acid and/or methacrylic acid to introduce from 3 to 4 mols in average of the polymerizable group thereinto; or those to be obtained by reacting 1 mol of hexitol with epihalohydrin to introduce from 3 to 4 mols of epoxy group into the product, and further with acrylic acid and/or methacrylic acid to introduce from 3 to 4 mols in average of the polymerizable group thereinto. Those preferred compounds shall have from 3 to 4 ethylenic unsaturated bonds and from 3 to 6 hydroxyl groups in one molecule, and therefore have good photo-polymerizability. In addition, the photosensitive layer comprising any of those compounds is preferred, as its adhesiveness to the overlying ink-repellent layer and to the underlying support or primer layer is good.

Specific examples of the compound having the structure of formula (I-2) are mentioned below, which, however, are not limitative. In general, these compounds are obtained by reacting hexitol-polyglycidyl ether with acrylic acid and/or methacrylic acid, as has been mentioned hereinabove, but may be obtained by any other different methods. The terminology (meth)acryl as referred to herein indicates acrylic group and methacrylic group. 1,2,3-Tri(2-hydroxy-3-(meth)acryloxypropyloxy)-4,5,6-trihydroxyhexane, 1,2,4-tri(2-hydroxy-3-(meth)acryloxypropyloxy)-3,5,6-trihydroxyhexane, 1,2,5-tri(2-hydroxy-3-(meth)acryloxypropyloxy)-3,4,6-trihydroxyhexane, 1,2,6-tri(2-hydroxy-3-(meth)acryloxypropyloxy)-3,4,5-trihydroxyhexane, 2,3,4-tri(2-hydroxy-3-(meth)acryloxypropyloxy)-1,5,6-trihydroxyhexane, 2,3,5-tri(2-hydroxy-3-(meth)acryloxypropyloxy)-1,4,6-trihydroxyhexane, 1,3,4-tri(2-hydroxy-3-(meth)acryloxypropyloxy)-2,5,6-trihydroxyhexane, 1,3,5-tri(2-hydroxy-3-(meth)acryloxypropyloxy)-2,4,6-trihydroxyhexane, 1,3,6-tri(2-hydroxy-3-(meth)acryloxypropyloxy)-2,4,5-trihydroxyhexane, 1,4,5-tri(2-hydroxy-3-(meth)acryloxypropyloxy)-2,3,6-trihydroxyhexane, 1,2,3,4-tetra(2-hydroxy-3-(meth)acryloxypropyloxy)-5,6-dihydroxyhexane, 1,2,3,5-tetra(2-hydroxy-3-(meth)acryloxypropyloxy)-4,6-dihydroxyhexane, 1,2,3,6-tetra(2-hydroxy-3-(meth)acryloxypropyloxy)-4,5-dihydroxyhexane, 1,2,4,5-tetra(2-hydroxy-3-(meth)acryloxypropyloxy)-3,6-dihydroxyhexane, 1,2,4,6-tetra(2-hydroxy-3-(meth)acryloxypropyloxy)-3,5-dihydroxyhexane, 1,2,5,6-tetra(2-hydroxy-3-(meth)acryloxypropyloxy)-3,4-dihydroxyhexane, 2,3,4,5-tetra(2-hydroxy-3-(meth)acryloxypropyloxy)-1,6-dihydroxyhexane, 1,2,3-tri(2-hydroxy-3-(meth)acryloxypropyloxy)-4-(meth)acryloxy-5,6-dihydroxyhexane, 1,2,4-tri(2-hydroxy-3-(meth)acryloxypropyloxy)- 3-(meth)acryloxy-5,6-dihydroxyhexane, 1,2,5-tri(2-hydroxy-3-(meth)acryloxypropyloxy)-4-(meth)acryloxy-3,6-dihydroxyhexane, 1,2,6-tri(2-hydroxy-3-(meth)acryloxypropyloxy)-4-(meth)acryloxy-3,5-dihydroxyhexane, 1,2-di(2-hydroxy-3-(meth)acryloxypropyloxy)-3,4-di(meth)acryloxy-5,6-dihydroxyhexane, 1,3-di(2-hydroxy-3-(meth)acryloxypropyloxy)-2,4-di(meth)acryloxy-5,6-dihydroxyhexane, 1,4-di(2-hydroxy-3-(meth)acryloxypropyloxy)-2,3-di(meth)acryloxy-5,6-dihydroxyhexane, 1,2-di(2-hydroxy-3-(meth)acryloxypropyloxy)-5,6-di(meth)acryloxy-3,4-dihydroxyhexane, etc.

Examples of pentitol-derived compounds (A) are as follows:

1,2,3-Tri(2-hydroxy-3-(meth)acryloxypropyloxy)-4,5-dihydroxypentane, 1,2,4-tri(2-hydroxy-3-(meth)acryloxypropyloxy)-3,5-dihydroxypentane, 1,3,4-tri(2-hydroxy-3-(meth)acryloxypropyloxy)-2,5-dihydroxypentane, 1,3,5-tri(2-hydroxy-3-(meth)acryloxypropyloxy)-2,4-dihydroxypentane, 1,213,4-tetra(2-hydroxy-3-(meth)acryloxypropyloxy)-5-hydroxypentane, 1,2,3,5-tetra(2-hydroxy-3-(meth)acryloxypropyloxy)-4-hydroxypentane, 1,2,4,5-tetra(2-hydroxy-3-(meth)acryloxypropyloxy)-3-hydroxypentane, 1,2,3,4,5-penta(2-hydroxy-3-(meth)acryloxypropyloxy)pentane.

Examples of tetritol-derived compounds (A) are 1,2,3,4-tetra(2-hydroxy-3-(meth)acryloxypropyloxy)butane, 1,2,3-tri(2-hydroxy-3-(meth)acryloxypropyloxy)-4-hydroxybutane, 1,2,3-tri(2-hydroxy-3-(meth)acryloxypropyloxy)-3-hydroxybutane.

As containing the compound (A), the photosensitive layer is soft as a whole enough to ensure good printing durability of the plate, while having improved sensitivity to exposure. In addition, the layer is kept nearly neutral and therefore has good storage stability. In particular, where the photosensitive layer contains the compound (A) having free hydroxyl group(s), the adhesiveness between the layer and the overlying ink-repellent layer and between the layer and the underlying support or primer layer is much improved, resulting in improving the image reproducibility and the printing durability of the plate.

The photosensitive layer of the plate of the invention may contain a compound having the structure of the following chemical formula (II) thereby further improving the properties of the plate.

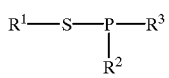

(II)

wherein $R^1$ to $R^3$ each independently represent at least one selected from a hydrogen atom, and a substituted or unsubstituted alkyl group having from 1 to 50 carbon atoms, a substituted or unsubstituted alkenyl group having from 2 to 50 carbon atoms and a substituted or unsubstituted aryl group having from 4 to 50 carbon atoms, which may optionally have any of ether bond, thioether bond, amino bond, oxo bond, ester bond, amido bond, carbonate bond, urethane bond and urea bond in their chains;

Of the compounds of formula (II), preferred are those having the structure of the following chemical formula (III):

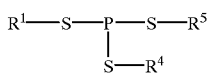

(III)

wherein $R^1$ has the same meaning as in formula (II);

$R^4$ and $R^5$ each independently represent at least one selected from a hydrogen atom, and a substituted or unsubstituted alkyl group having from 1 to 50 carbon atoms, a substituted or unsubstituted alkenyl group having from 2 to 50 carbon atoms and a substituted or unsubstituted aryl group having from 4 to 50 carbon atoms, which may optionally have any of ether bond, thioether bond, amino bond, oxo bond, ester bond, amido bond, carbonate bond, urethane bond and urea bond in their chains;

In those phosphorus compounds, preferably, $R^1$ to $R^5$ each are a substituted or unsubstituted alkyl group, more preferably an alkyl group having from 1 to 30 carbon atoms and having any of ether bond, ester bond and thioether bonds in their chains. Specific examples of the structure are mentioned below, which, however, are not limitative.

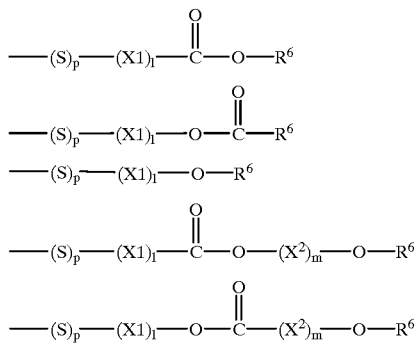

wherein $X^1$ and $X^2$ each represent a linking group;

l, m and p each indicate the presence or absence of the linking group, and is 0 or 1;

$R^6$ has the same meaning as $R^4$ or $R^5$.

In those structures illustrated above, the linking groups $X^1$ and $X^2$ each independently indicate a substituted or unsubstituted alkylene group having from 1 to 50 carbon atoms, a substituted or unsubstituted alkenylene group having from 2 to 50 carbon atoms and a substituted or unsubstituted arylene group having from 4 to 50 carbon atoms, which may optionally have any of ether bond, thioether bond, amino bond, oxo bond, ester bond, amido bond, carbonate bond, urethane bond and urea bond in their chains. As specific examples of $X^1$ and $X^2$, mentioned are a methylene group, an ethylene group, a propylene group, a butylene group, a hexylene group, an octylene group, a decylene group, an oxymethylene group, an oxyethylene group, an oxypropylene group, an oxybutylene group, an oxyhexylene group, an oxyoctylene group, a thiomethylene group, a thioethylene group, a thiopropylene group, a thiobutylene group, a thiohexylene group, a thiooctylene group, etc., but these are not limitative. The specific examples of $R^6$ include a methyl group, an ethyl group, a propyl group, a butyl group, a hexyl group, an octyl group, a nonyl group, a decyl group, a dodecyl group, etc., which, however, are not limitative. $R^6$ may be of any others than those examples.

The compounds having the structure of formula (II) or (III) generally function as an oxygen-trapping agent that traps oxygen having been excited by light. In photopolymerization, oxygen acts as a polymerization inhibitor. Using the oxygen-trapping agent having the structure of formula (II) or (III) in photo-polymerization much reduces the polymerization inhibition by oxygen, thereby improving photo-polymerization efficiency. The compounds of formulae (II) and (III) are greatly effective in photopolymerization at low temperatures. Accordingly, using the compounds having the structure of formula (II) or (III) gives non-processed plates for waterless lithographic printing plates which are not adversely affected by temperature in exposure.

Considering the printing durability of the printing plates to be formed, it is desirable that the initial elasticity of the exposed photosensitive layer of the non-processed plate of the invention falls between 5 and 75 kgf/mm$^2$, and the breaking elongation thereof is not smaller than 10%. (1 kgf/mm$^2$=9.80665 MPa.) For this, any other photo-reactive compounds and binder polymers may be added to the photosensitive layer.

For the photo-reactive compounds, employable herein is any and every one generally used in ordinary resist materials, photosensitive compositions and non-processed photosensitive plates for printing plates. For example, the photo-reactive compounds usable herein include photo-polymerizable compounds, photo-dimerizable compounds, quinonediazide compounds, diazo compounds, and azide compounds, which, however, are not limitative. Of those, preferred are photo-polymerizable compounds, photo-dimerizable compounds and diazo compounds. and more preferred are poly-functional monomers of photo-polymerizable compounds, and diazo resins of diazo compounds.

Examples of the poly-functional monomers are mentioned below, which, however, are not limitative.

① Amino Group-having Monomers:

Amino group-having monomers include, for example, reaction products of amine compounds, such as monoamine compounds, diamine compounds and polyamine compounds, and ethylenic unsaturated group-having compounds such as glycidyl methacrylate, methacrylic acid, methacrylic anhydride, etc. Examples of the amine compounds are mentioned below.

Butylamine, hexylamine, octylamine, 1,3-propanediamine, 1,4-butanediamine, 1,6-hexanediamine, 1,8-octanediamine, monoxyethylenediamine, dioxyethylenediamine, trioxyethylenediamine, polyoxyethylenediamine, monoxypropylenediamine, dioxypropylenediamine, trioxypropylenediamine, polyoxypropylenediamine, N-hydroxyethylhexapropylenediamine, N-hydroxyisopropylhexapropylenediamine, N,N'-dihydroxyethylhexapropylenediamine, trimethylene-bis(4-aminobenzoate), xylylenediamine, N-hydroxyethyl-m-xylylenediamine, N-hydroxyisopropyl-m-xylylenediamine, etc.

Specific examples of the amino group-having monomers are mentioned below, which, however, are not limitative.

N,N,N',N'-Tetra(2-hydroxy-3-methacryloxypropyl)-monoxyethylenediamine, N,N,N',N'-tetra(2-hydroxy-3-methacryloxypropyl)-dioxyethylenediamine, N,N,N',N'-tetra( 2-hydroxy-3-methacryloxypropyl)-decaoxyethylenediamine, N,N,N',N'-tetra(2-hydroxy-3-methacryloxypropyl)-tritriacontaoxyethylenediamine, N,N,N',N'-tetra(2-hydroxy-3-acryloxypropyl)-trioxyethylenediamine, N,N,N'-tri(2-hydroxy-3-methacryloxypropyl)-N'-mono(2-hydroxy-3-methoxypropyl)-monoxyethylenediamine, N,N,N'-tri(2-hydroxy-3-methacryloxypropyl)-N'-mono(2-hydroxy-3-methoxypropyl)-dioxyethylenediamine, N,N'-di(2-hydroxy-3-methacryloxypropyl)-N,N'-di-(2-hydroxy-3-methoxypropyl)-monoxyethylenediamine, N,N'-di(2-hydroxy-3-methacryloxypropyl)-N,N'-di(2-hydroxy-3-methoxypropyl)-dioxyethylenediamine, N,N,N'-tri(2-hydroxy-3-methacryloxypropyl)-N'-mono(2-hydroxy-3-butoxypropyl)-monoxyethylenediamine, N,N,N'-tri(2-hydroxy-3-methacryloxypropyl)-N'-mono(2-hydroxy-3-butoxypropyl)-dioxyethylenediamine, N,N'-di(2-hydroxy-3-methacryloxypropyl)-N,N'-di(2-hydroxy-3-butoxypropyl)-monoxyethylenediamine, N,N'-di(2-hydroxy-3-methacryloxypropyl)-N,N'-di(2-hydroxy-3-butoxypropyl)-dioxyethylenediamine, N,N,N',N'-tetra(2-hydroxy-3-methacryloxypropyl)-monoxypropylenediamine, N,N,N',N'-tetra(2-hydroxy-3-methacryloxypropyl)-decaoxypropylenediamine, N,N,N',N'-tetra(2-hydroxy-3-acryloxypropyl)-trioxypropylenediamine, N,N,N',N'-tetra(2-hydroxy-3-acryloxypropyl)-hexaoxypropylenediamine, N,N,N'-tri(2-hydroxy-3-methacryloxypropyl)-N'-mono(2-hydroxy-3-methoxypropyl)monoxypropylenediamine, N,N,N'-tri(2-hydroxy-3-methacryloxypropyl)-N'-mono(2-hydroxy-3-methoxypropyl)-dioxypropylenediamine, N,N,N'-tri(2-hydroxy-3-methacryloxypropyl)-N'-mono(2-hydroxy-3-methoxypropyl)-decaoxypropylenediamine, N,N'-di(2-hydroxy-3-methacryloxypropyl)-N,N'-di(2-hydroxy-3-methoxypropyl)-monoxypropylenediamine, N,N'-di(2-hydroxy-3-methacryloxypropyl)-N,N'-di(2-hydroxy-3-methoxypropyl)-dioxypropylenediamine, N,N,N'-tri(2-hydroxy-3-methacryloxypropyl)-N'-mono(2-hydroxy-3-butoxypropyl)-monoxypropylenediamine, N,N,N'-tri(2-hydroxy-3-methacryloxypropyl)-N'-mono(2-hydroxy-3-butoxypropyl)-dioxypropylenediamine, N,N'-di(2-hydroxy-3-methacryloxypropyl)-N,N'-di(2-hydroxy-3-butoxypropyl)-monoxypropylenediamine, N,N'-di(2-hydroxy-3-butoxypropyl)-dioxypropylenediamine, N,N,N'-tri(2-hydroxy-3-methacryloxypropyl)-N'-mono(2-hydroxy-3-(2-ethylhexyloxy)propyl)-trioxypropylenediamine, N,N,N',N'-tri(2-hydroxy-3-methacryloxypropyl)-N'-mono(2-hydroxy-3-phenoxypropyl)-trioxypropylenediamine, N,N,N',N'-tetra(2-hydroxy-3-methacryloxypropyl)-m-xylylenediamine, N,N,N',N'-tetra(2-hydroxy-3-methacryloxypropyl)-p-xylylenediamine, N,N,N',N'-tetra(2-hydroxy-3-acryloxypropyl)-m-xylylenediamine, N,N,N',N'-tetra(2-hydroxy-3-acryloxypropyl)-p-xylylenediamine, N,N,N'-tri(2-hydroxy-3-methacryloxypropyl)-N'-mono(2-hydroxy-3-methoxypropyl)-m-xylylenediamine, N,N,N'-tri(2-hydroxy-3-methacryloxypropyl)-N'-mono(2-hydroxy-3-methoxypropyl)-p-xylylenediamine, N,N'-di(2-hydroxy-3-methacryloxypropyl)-N,N'-di(2-hydroxy-3-methoxypropyl)-m-xylylenediamine, N,N'-di(2-hydroxy-3-methacryloxypropyl)-N,N'-di(2-hydroxy-3-methoxypropyl)-p-xylylenediamine, N-mono(2-hydroxy-3-methacryloxypropyl)-N,N',N'-tri(2-hydroxy-3-methoxypropyl)-m-xylylenediamine, N-mono(2-hydroxy-3-methacryloxypropyl)-N,N',N'-tri(2-hydroxy-3-methoxypropyl)-p-xylylenediamine, N,N,N'-tri(2-hydroxy-3-acryloxypropyl)-N'-mono(2-hydroxy-3-methoxypropyl)-m-xylylenediamine, N,N,N'-tri(2-hydroxy-3-acryloxypropyl)-N'-mono(2-hydroxy-3-methoxypropyl)-p-xylylenediamine, etc.

Apart from the amino group-having monomers mentioned above, active silyl group-having monomers are also employable as improving the adhesiveness of the photosensitive layer to the overlying ink-repellent layer. Where the overlying ink-repellent layer is a silicone rubber layer, preferred are monomers having an active silyl group such as an acetoxysilyl group, an alkoxysilyl group, a ketoxime-silyl group, a hydrogensilyl group, a halogenosilyl group, etc.

② Monomers with no Amino Group:

As monomers with no amino group, for example, mentioned are ethylenic unsaturated bond-having compounds. Of those, preferred are hydroxyl group-having monomers to be produced, for example, through reaction of a glycidyl group and a carboxylic acid.

Specific examples of the monomers with no amino group are mentioned below, which, however, are not limitative. (Meth)acrylic acid, methyl (meth)acrylate, ethyl (meth)acrylate, propyl (meth)acrylate, butyl (meth)acrylate, hexyl (meth)acrylate, glycidyl (meth)acrylate, 1,4-butane di(meth)acrylate, 1,6-hexane di(meth)acrylate, 1,8-octane di(meth)acrylate, 1,9-nonane di(meth)acrylate, 1,10-decane di(meth)acrylate, ethylene glycol di(meth)acrylate, diethylene glycol di(meth)acrylate, triethylene glycol di(meth)acrylate, polyethylene glycol di(meth)acrylate, propylene glycol di(meth)acrylate, dipropylene glycol di(meth)acrylate, polypropylene glycol di(meth)acrylate; products of 1 mol of glycerin and from 1 to 3 mols of (meth)acrylic acid; products of 1 mol of trimethylolpropane and from 1 to 3 mols of (meth)acrylic acid; products of 1 mol of pentaerythritol and from 1 to 4 mols of (meth)acrylic acid; products of polyvinyl alcohol and (meth)acrylic acid; products of poly-alcohol and (meth)acrylic acid; products of monocarboxylic acid and glycidyl (meth)acrylate; products of poly-carboxylic acid, such as maleic acid or adipic acid, and glycidyl (meth)acrylate; products of epoxy compound and (meth)acrylic acid; products of poly-epoxy compound and (meth)acrylic acid, etc.

Apart from the monomers with no amino group mentioned above, active silyl group-having monomers with no amino group are also employable as improving the adhesiveness of the photosensitive layer to the overlying ink-repellent layer. Where the overlying ink-repellent layer is a silicone rubber layer, preferred are those having an active silyl group such as an acetoxysilyl group, an alkoxysilyl group, a ketoxime-silyl group, a hydrogensilyl group, a halogenosilyl group, etc.

The diazo resins include, for example, condensates of 4-diazodiphenylamine and formaldehyde. The anion for the compounds includes, for example, chloride ion, and anions of tetrachlorozincate, tetrafluoroboride, hexafluorophosphate, triisopropylnaphthalenesulfonate, 4,4'-biphenyldisulfonate, 2,5-dimethylbenzenesulfonate, 2-nitrobenzenesulfonate, 2-methoxy-4-hydroxy-5-benzoylbenzenesulfonate, etc., which, however, are not limitative. Apart from 4-diazodiphenylamines, any other diazo monomers are employable. The condensing agent is not limited to only formaldehyde, but includes, for example, acetaldehyde, propionaldehyde, butylaldehyde, isobutylaldehyde, benzaldehyde, etc.

To make the exposed photosensitive layer have an initial elasticity of from 5 to 75 kgf/mm2 and a breaking elongation of not smaller than 10%, preferably, the binder polymer to be used shall have a glass transition point (Tg) of not higher than 20° C., more preferably not higher than 0° C. Specific examples of the binder polymer having a glass transition point (Tg) of not higher than 20° C. are mentioned below, which, however, are not limitative. As the case may be, any other binder polymers having a glass transition point (Tg) of 20° C. or higher may be used; or binder polymers having a glass transition point (Tg) of not higher than 20° C. may be suitably combined with those having Tg of 20° C. or higher.

(1) Vinyl Polymers:

Specific examples of vinyl polymers, or that is addition polymers of vinyl compounds, having Tg of not higher than 20° C. usable herein are mentioned below, which, however, are not limitative.

(a) Polyolefins:

Poly(1-butene), poly(5-cyclohexyl-2-pentene), poly(1-decene), poly(1,1-dichloroethylene), poly(1,1-dimethylbutene), poly(1,1-dimethylpropene), poly (1-dodecene), polyethylene, poly(1-heptene), poly(1-hexene), polymethylene, poly(6-methyl-1-heptene), poly(5-methyl-1-hexene), poly(2-methylpropene), poly(1-nonene), poly(1-octene), poly(1-pentene), poly(5-phenyl-1-pentene), polypropylene, polyisobutylene, poly(1-butene), poly(vinyl butyl ether), poly(vinyl ethyl ether), poly(vinyl isobutyl ether), poly(vinyl methyl ether), etc.

(b) Polystyrenes:

Poly(4-[(2-butoxyethoxy)methyl]styrene), poly(4-decylstyrene), poly(4-dodecylstyrene), poly[4-(2-ethoxyethoxymethyl)styrene], poly([4-(1-ethylhexyloxymethyl)styrene], poly[4-(hexyloxymethyl)styrene], poly(4-hexylstyrene), poly(4-nonylstyrene), poly[4-(octyloxymethyl)styrene], poly(4-octylstyrene), poly(4-tetradecylstyrene), etc.

(c) (Meth)acrylate Polymers:

Poly(butyl acrylate), poly[2-(2-cyanoethylthio)ethyl acrylate], poly[3-(2-cyanoethylthio)propyl acrylate], poly[6-(cyanoethylthio)hexyl acrylate], poly(2-ethoxyethyl acrylate), poly(ethyl acrylate), poly(2-ethylhexyl acrylate), poly(hexyl acrylate), poly(3-methoxypropyl acrylate), poly (octyl acrylate), poly(hydroxyethyl acrylate), poly (hydroxypropyl acrylate), poly(decyl methacrylate), poly (dodecyl methacrylate), poly(2-ethylhexyl methacrylate), poly(octadecyl methacrylate), poly(tetradecyl methacrylate), poly(n-hexyl methacrylate), poly(lauryl methacrylate), etc.

(2) Non-vulcanized Rubbers:

Specific examples of non-vulcanized rubbers having Tg of not higher than 20° C. are mentioned below, which, however, are not limitative.

Poly(1,3-butadiene), poly(2-chloro-1,3-butadiene), poly (2-decyl-1,3-butadiene), poly(2,3-dimethyl-1,3-butadiene), poly(2-ethyl-1,3-butadiene), poly(2-heptyl-1,3-butadiene), poly(2-isopropyl-1,3-butadiene), poly(2-methyl-1,3-butadiene), chlorosulfonated polyethylene, etc.

(3) Polyoxides (polyethers):

Specific examples of polyoxides having Tg of not higher than 20° C. are mentioned below, which, however, are not limitative.

Polyacetaldehyde, poly(butadiene-oxide), poly(1-butene-oxide), poly(dodecene-oxide), poly(ethylene-oxide), poly (isobutene-oxide), polyformaldehyde, poly(propylene-oxide), poly(tetramethylene-oxide), poly(trimethylenoxide), etc.

(4) Polyesters:

Specific examples of polyesters having Tg of not higher than 20° C. are mentioned below, which, however, are not limitative.

Poly[1,4-(2-butene) sebacate], poly[1,4-(2-butene) sebacate], poly(decamethylene adipate), poly(ethylene adipate), poly(oxydiethylene ado ate), poly(oxydiethylene adipate), poly(oxydiethylene azelate), poly(oxydiethylene dodecane-diate), poly (oxydiethylene glutarate), poly(oxydiethylene heptyl malonate), poly(oxydiethylene malonate), poly (oxydiethylene methyl malonate), poly(oxydiethylene nonyl malonate), poly(oxydiethylene octadecane-diate), poly (oxydiethylene oxalate), poly(oxyethylene pimelate), poly (oxydiethylene sebacate), poly(pentamethylene adipate), poly(tetramethylene adipate), poly(trimethylene adipate), etc.

(5) Polyurethanes:

Polyurethanes to be obtained from polyisocyanates and polyalcohols generally have Tg of not higher than 20° C. The polyalcohols include, for example, ethylene glycol, propylene glycol, 1,4-butanediol, 1,6-hexanediol, diethylene glycol, dipropylene glycol, polyethylene glycol, polypropylene glycol, glycerin, trimethylolpropane, etc., which, however, are not limitative. The polyisocyanates include, for example, paraphenylene diisocyanate, toluylene diisocyanate, diphenylmethane diisocyanate, tolidine diisocyanate, xylylene diisocyanate, hexamethylene diisocyanate, isophorone diisocyanate, etc., which, however, are not limitative.

(6) Polyamides:

Specific examples of polyamides having Tg of not higher than 20° C. are mentioned below, which, however, are not limitative.

Copolyamides with polyether segments having a molecular weight of from 150 to 1500, more concretely, amino-terminated copolyamides of which each polyether segment moiety has a molecular weight of from 150 to 1500 and which contain from 30 to 70% by weight of constituent units of polyoxyethylene and aliphatic dicarboxylic acid or diamine, etc.

The binder polymers of (1) to (6) noted above may be used either singly or as combined. Of those, preferred are polyurethanes, polyesters, vinyl-based polymers, and non-vulcanized rubbers. Especially preferred are hydroxyl group-having binder polymers.

Optionally but preferably, the photosensitive layer constituting the plate of the invention may contain suitable amounts of various additives such as dyes, pigments, pH indicators, printing-out agents, surfactants, polymerization inhibitors, acids, bases, photo-initiators, photo-sensitizers, photo-sensitization promoters, etc. For example, the dyes include basic dyes and acidic dyes; the printing-out agents include photochromic compounds; the surfactants include nonionic surfactants; the polymerization inhibitors include hydroquinone compounds; the acids include carboxylic acids and sulfonic acids; the bases include organic amine compounds; the photo-initiators and photo-sensitizers include benzoin compounds, benzophenone compounds, thioxanthone compounds, acridone compounds, xanthone compounds, anthracene compounds, azobis compounds, etc. However, these are not all limitative.

To ensure much higher printing durability of the plate of the invention, it is desirable that the initial elasticity of the exposed photosensitive layer of the plate falls between 5 and 75 kgf/mm², preferably between 10 and 65 kgf/mm², more preferably between 10 and 60 kgf/mm², even more preferably between 10 and 50 kgf/mm². If the exposed photosensitive layer has too small initial elasticity, the layer is brittle and is therefore easily broken during printing operation. However, if it has too large initial elasticity, the layer is too hard and is therefore often broken at the adhesion interface between the layer and the overlying ink-repellent layer to lower the printing durability of the plate especially in offset printing operation where external stress is repeatedly applied to the interface between the photosensitive layer and the ink-repellent layer.

Also preferably, the exposed photosensitive layer has a breaking elongation of not smaller than 10%, more preferably not smaller than 50%, even more preferably not smaller than 100%. If the exposed photosensitive layer has too small breaking elongation, the layer is brittle and is therefore often broken during offset printing operation to lower the printing durability of the plate.

The initial elasticity and the breaking elongation of the exposed photosensitive layer are measured according to the methods mentioned below.

[Initial Elasticity and Breaking Elongation of Photosensitive Layer]

The tensile characteristics of the photosensitive layer are measured according to JIS K6301. Precisely, a non-exposed plate sample is dipped in a soluble solvent to dissolve and remove the ink-repellent layer and the photosensitive layer from the support. The resulting solution is filtered to remove the insoluble ink-repellent component from the solvent. Then, the filtrate was concentrated under reduced pressure to have a solid content of 30%. This is a photosensitive liquid. This is applied onto a glass plate and dried, and the sheet formed on the glass plate is peeled off. The thus-obtained sheet having a thickness of about 300 μm is cut into test pieces of No. 4 dumbbell in shape. These test pieces are exposed at 12 mW/cm², as measured with a UV meter (Oak Seisakushols Light Measure Type UV365), for 10 minutes, using a 3 kW ultra-high pressure mercury lamp (of Oak Seisakusho). The thus-exposed test pieces are stretched at a stretching speed of 20 cm/min, using Orientec's Tensilon RTM-100, according to JIS K6301 to measure their initial elasticity and breaking elongation.

Regarding the amounts of the components constituting the photosensitive layer, preferably, the layer comprising the compound having the structure of formula (I) contains from 0 to 10,000 parts by weight, more preferably from 5 to 1,000 parts by weight, even more preferably from 10 to 500 parts by weight of other photo-reactive compounds, from 0.1 to 200 parts by weight, more preferably from 1 to 100 parts by weight, even more preferably from 5 to 50 parts by weight of the compound having the structure of formula (II), from 0 to 10,000 parts by weight, more preferably from 10 to 8,000 parts by weight, even more preferably from 100 to 2,000 parts by weight of a binder polymer, and from 0 to 100 parts by weight, more preferably from 0 to 50 parts by weight, even more preferably from 0.5 to 40 parts by weight of additives such as dyes, pigments, pH indicators, printing-out agents, surfactants, polymerization inhibitors, acids, bases, photo-initiators, photo-sensitizers and photo-sensitization promoters, relative to 100 parts of the compound of formula (I). The plates having the photosensitive layer that comprises those components within the defined ranges have good image reproducibility, printing durability and storage stability. Especially, the image reproducibility of the plates through low-temperature exposure is good.

The thickness of the photosensitive layer may be from 0.1 to 100 μm, but preferably from 0.5 to 50 μm, more preferably from 0.5 to 20 μm. Too thin photosensitive layers are unfavorable as they often have pin holes and other defects after coated. Too thick photosensitive layers ale uneconomical.

Hereinunder described is the ink-repellent layer constituting the plate of the invention.

The ink-repellent layer may comprise silicone rubber or fluorine resin. Preferred is silicone rubber, as its material is easily available and its ink-repellability is high.

Silicone rubber capable of being used in the invention may be grouped into the following two. However, the invention is not limited to the examples mentioned below.

(1) Silicone rubber to be obtained through condensation reaction:

To form condensates of silicone rubber, in general, a linear organic polysiloxane having repetitive units of the following chemical formula (IV) and having a molecular weight of from thousands to hundreds of thousands is crosslinked with a crosslinking agent. In general, the organic polysiloxane shall have 2 or more silanol groups in the molecule, and are silanol-terminated.

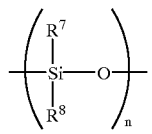

(IV)

wherein n represents an integer of 2 or more; $R^7$ and $R^8$ each represent at least one selected from a substituted or unsubstituted alkyl group having from 1 to 50 carbon atoms, a substituted or unsubstituted alkenyl group having from 2 to 50 carbon atoms, and a substituted or unsubstituted aryl group having from 4 to 50 carbon atoms, and these may be the same or different.

Preferably, in formula (IV), $R^7$ and $R^8$ are any of vinyl, phenyl, halogenovinyl and halogenophenyl groups in a ratio of 40% or less to the total, and are methyl groups in a ratio of 60% or more to the total.

The linear organic polysiloxane of that type may be, after having been cured through condensation, heat-treated in a system containing an organic peroxide into crosslinked silicone rubber.

The linear polysiloxane is generally crosslinked with a crosslinking agent such as that of the following chemical formula (V):

$$R^9{}_q SiZ_{4-q} \qquad (V)$$

wherein q represents an integer of from 0 to 2;
$R^9$ represents an alkyl group, an alkenyl group, an aryl group, or a combination of those groups, which may have functional substituent(s) of a halogen atom, an amino group, a hydroxyl group, an alkoxy group, an aryloxy group, a (meth)acryloxy group, a thiol group, etc.;
Z represents a hydrogen atom, a hydroxyl group, or a hydrolyzable group such as an alkoxy group, an acyloxy group, a ketoxime group, an amido group, an aminoxy group, an amino group, etc.

Concretely mentioned are acetoxysilane, ketoximesilane, alkoxysilane, aminosilane and amidosilane having any of glycidyl, methacrylic, allyl and vinyl groups, which, however, are not limitative.

The silicone rubber composition comprising the linear polysiloxane and the crosslinking agent may optionally contain a catalyst compound having a metal such as tin, zinc, lead, calcium, manganese, titanium or the like.

(2) Silicone Rubber to be Obtained through Addition Reaction:

To form adducts of silicone rubber, in general, a polysiloxane compound having 2 or more ethylenic unsaturated bonds in the molecule is reacted with a polyhydrogen-polysiloxane compound. The polysiloxane compound having 2 or more ethylenic unsaturated bonds in the molecule includes, for example, a,w-divinyl-polydimethylsiloxanes, (methylvinylsiloxane)(dimethylsiloxane) copolymers having methyl groups at its both terminals, etc. The polyhydrogen-polysiloxane compound includes, for example, a,w-dimethyl-polymethylhydrogensiloxanes, (methylhydrogensiloxane) (dimethylsiloxane) copolymers having methyl groups at its both terminals, etc.

The adduct silicone rubber composition comprising the polysiloxane compound having 2 or more ethylenic unsaturated bonds in the molecule and the polyhydrogen-polysiloxane compound may optionally contain a catalyst of, for example, simple platinum, platinum chloride, olefin-coordinated platinum, etc.

The thickness of the ink-repellent layer may be from 0.5 to 100 μm, but preferably from 0.5 to 10 μm, more preferably from 1.0 to 5 μm. Too thin ink-repellent layers are unfavorable in view of the printing durability of the plates and of the ink-repellability of the layers. Too thick ink-repellent layers are also unfavorable since they are uneconomical and since they are difficult to remove in development thereby worsening the image reproducibility of the plates.

It is important to protect the non-processed plates for waterless lithographic printing plates of the invention, of which the constitution has been described in detail hereinabove, by coating the surface of the ink-repellent layer with a protective layer. This is to protect the ink-repellent layer and to improve the contact adhesiveness of the plates to films for exposure. For this, for example, a thin, plane or roughened, protective film is laminated over the ink-repellent layer; or a thin plastic sheet is formed on the ink-repellent layer through coating or transfer. The protective layer is effective in protecting the ink-repellent layer during exposure, but shall be peeled or removed through dissolution prior to development or shall be removed through dissolution during development, since this is unnecessary for printing operation.

The protective film usable herein shall transmit rays for exposure, such as ultraviolet rays, and generally has a thickness of not larger than 100 μm, preferably not larger than 10 μm. As specific examples, mentioned are films of polyethylene, polypropylene, polyvinyl chloride, polyethylene terephthalate, cellophane, etc.

The surface of the protective film may be roughened in order to improve its adhesiveness to films for exposure. To roughen it, for example, grains having, as measured in the Coulter counter method, a mean grain size of from 1 to 30 μ, preferably from 4 to 9 μ and a refractive index of from 1.0 to 2.0, preferably from 1.4 to 1.7 are applied to the protective film. The thickness of the thus-coated grains is generally not larger than 10 μm, preferably not larger than 4 μm. The lowermost limit of the thickness is not specifically defined, but is generally not smaller than 0.1 μm in view of the coatability of the grains. As examples of the grains, mentioned are natural silica (Minex #7 by Shiraishi Industry), sodium carbonate (Whiton P-30 by Shiraishi Industry), synthetic silica (Siloid 63 by Fuji Devison Chemical), mica, corn starch, epoxy grains, etc. To uniformly and firmly adhere the grains to the protective film, a suitable polymer compound may be mixed with the grains prior to coating. The polymer compound must be UV-transmissive. For this, therefore, preferably used are UV-transmissive materials of polyethylene, polypropylene, polyvinyl chloride, polyethylene terephthalate and cellophane, such as those mentioned hereinabove for the protective film. In place of applying the grains onto the protective film, the surface of the protective film may be mechanically ground. In place of laminating the protective film over the ink-repellent layer, the ink-repellent layer may be coated with a protecting material to form a protective layer thereon. The protective layer is preferably roughened in the same manner as above.

The protective layer preferably contain a photo-fading substance or a photo-coloring substance. Examples of the photo-fading substance are mentioned below, which, however, are not limitative.

(1) Disperse dyes, such as azo disperse dyes (C.I. Disperse Orange 30, Disperse Yellow 114, C.I. Disperse Orange 13, C.I. Disperse Yellow, etc.), quinophthalone disperse dyes (C.I. Disperse Yellow 64, etc.), nitrophenylamine disperse dyes (C.I. Disperse Yellow 42, etc.), etc.;

(2) Cationic dyes, such as conjugated azo cationic dyes (C.I. Basic Yellow 25, etc.), cationic styryl dyes (C.I. Basic Yellow 11, C.I. Basic Yellow 28, C.I. Basic Yellow 19, etc.), etc.;

(3) Reactive dyes, such as vinylsulfone reactive dyes (C.I. Reactive Blue 19, etc.), triazine reactive dyes (C.I. Reactive Orange 4, C.I. Reactive Orange 13, etc.), etc.;

(4) Other dyes, such as triphenylmethane-phthalide dyes (Crystal Violet Lactone, those in U.S. Pat. No. 2,548, 366, etc.), fluoran dyes (3-diethylamino-6-methylfluoran, etc.), phenothiazine dyes (3,7-bis (diethylamino)-10-benzoylphenothiazine, etc.), leucoauramine dyes, spiropyrane dyes (1,3,3-trimethylindoline-2,2'-6'-nitro-8'-methoxybenzopyrane, etc.), rhodamine-lactam dyes, triphenylmethane dyes, and mixtures of those dyes.

More concretely mentioned are benzoquinone-diazide compounds, naphthoquinone-diazide compounds, p-N,N-dimethylaminobenzene-diazonium zinc chloride, 4-morpholino-2,5-dibutoxybenzene-diazonium zinc chloride, 4-(4'-methoxy)benzoylamino-2,5-diethoxybenzene-diazonium zinc chloride, 4-morpholino-2, 5-diethoxybenzene-diazonium zinc chloride, p-N,N-diethoxyaminobenzene-diazonium tetrafluoroborate, 4-morpholinobenzene-diazonium tetrafluoroborate, 4-morpholino-2,5-dibutoxybenzene-diazonium tetrafloroborate, 4-pyrrolidino-3-methoxybenzene-diazonium tetrafluoroborate, 4-(p-tolylmercapto)-2,5-dimethoxybenzene-diazonium tetrafluoroborate, 4-morpholino-2,5-dibutoxybenzene-diazonium hexafluorophosphate, 4-(p-methoxy)benzoylamino-2,5-diethoxybenzene-diazonium tetrafluoroborate, 4-pyrrolidino-3-methylbenzene-diazonium hexafluorophosphate, 4-(p-tolylmercapto)-2,5-diethoxybenzene-diazonium hexafluorophosphate, etc.; as well as other various diazo compounds (e.g., 4-diazodiphenylamine and its condensates, 1-diazo-4-(N,N-dimethylamino)benzene and its condensates, 1-diazo-4-(N, N-diethylamino)benzene and its condensates, etc.), azide compounds (e.g., 2,6-dichloro-4-nitroazidobenzene, azidodiphenylbenzene, 3,3'-dimethoxy-4,4'-diazidodiphenyl, 4,4'-diazidodiphenylamine, etc.), etc.

Examples of the photo-coloring substances are mentioned below, which, however, are not limitative.

(1) Photochromic compounds, such as various spiropyrane compounds, various fulgide compounds, various diarylethene compounds, various azobenzene compounds, etc. Apart from these, also employable are any other photochromic compounds.

(2) Combination of materials capable of generating acids in light (optically-acid generating agents) and compounds capable of coloring with acids. The optically-acid generating agents include, for example, quinonediazide compounds (benzoquinonediazide compounds, naphthoquinonediazide compounds, etc.), onium compounds, oxime-sulfonate compounds, triazine compounds, phenyl-iodonium compounds, etc. Also employable are any other optically-acid generating agents. The compounds capable of coloring with acids include, for example, methyl yellow, orange IV, ethyl orange, naphthyl red, a-naphthol orange, methyl red, 4-aminoazobenzene, 4-phenylazodiphenylamine, metanil yellow, methyl orange, alizarin yellow GG, methyl violet, etc. Except these, also employable are any other compounds capable of coloring with acids.

To incorporate the photo-fading substance or photo-coloring substance into the protective layer, for example, the substance may be previously mixed with the material of the protective film or layer prior to forming the film or layer, or alternatively, it may be applied onto the protective film or layer formed. In the latter case, the substance may be mixed with the grains to be applied to the protective film or layer to roughen it.

Adding the photo-fading substance or photo-coloring substance to the protective layer is advantageous in that the plates are not influenced by exposure to light in processing operation in light. Accordingly, the plates may be processed not in yellow light but even in anti-fading light, and the processing efficiency for the plates is greatly improved. In particular, where the photosensitive layer contains an oxygen-trapping agent capable of trapping oxygen having excited by light, all the photosensitive layer is more often influenced by exposure to light. For this, therefore, the addition of the photo-fading substance or the photo-coloring substance to the protective layer is effective.

The non-processed plate of the invention may be processed into waterless lithographic printing plates, for example, in the manner mentioned below.

First, a support is optionally surface-treated for roughening its surface, then coated with a solution of a photosensitive composition, using any ordinary coater, such as reverse coater, air-knife coater, Meer bar coater or the like, or using any rotary coating device such as wheeler, thereafter dried, and then optionally cured under heat to form a photosensitive layer on the support. If desired, a primer layer may be interposed between the support and the photosensitive layer, for example, in the manner mentioned here in above. Next, a solution for an ink-repellent layer is applied onto the photosensitive layer in the same manner as above, and then fully cured by heating it for a few minutes generally at a temperature falling between 60 and 180° C. to form an ink-repellent layer. If desired, a protective layer is formed over the ink-repellent layer through coating, or a protective film is laminated thereover using a laminator, by which the ink-repellent layer is protected. As the case may be, a photo-fading substance or a photo-coloring substance such as that mentioned hereinabove may be applied onto the protective layer, whereby the protective layer is coated with the layer of the substance, and the two layers shall act as the protective layer in all.

The non-processed plate thus produced in the manner mentioned above is, after the protective layer of light-transmissive film, if provided on the plate, has been peeled off or not, or after the protective layer of poorly light-transmissive film, if provided thereon, has been peeled off, exposed to active rays through a contact positive film as air tightly adhered to the plate. The light source for this exposure shall be one capable of generating plenty of ultraviolet rays, which includes, for example, mercury lamp, carbon arc lamp, xenon lamp, metal halide lamp, tungsten lamp, fluorescent lamp, etc.

Next, the protective film, if still any, is peeled off, and thereafter the thus-exposed plate is developed using an automatic developing machine or by hand to remove the ink-repellent layer or the underlying photosensitive layer in the non-exposed region, whereby the photosensitive layer or the primer layer or the surface of the support is exposed out to be an ink-receiving area. As the case may be, the protective layer is also removed along with the non-exposed layer in this development. Preferably, the automatic developing machine to be used herein comprises a pre-processing zone, a developing zone and a post-processing zone in that order. As the case may be, the post-processing zone may be followed by a water-rinsing zone. As examples of the developing machine of that type, mentioned are Toray's developing machines of TWL-1160, and TWL-650, and developing machines disclosed in JP-A Hei-4-2265, Hei-5-2272 and Hei-5-6000. If desired, any of those developing machines may be combined for use in the invention.

As the pre-processing solution and the post-processing solution, usable are any conventional ones that are known usable in development of plates to give waterless lithographic printing plates. Water is generally used as the developer, but is not limitative. If desired, water, hydrophilic solvents, hydrophobic solvents and surfactants may be combined in any desired manner to give pre-processing solutions and developers for use in the invention. Oppositely to this, developer and post-processing solution may be combined. The post-processing solution may contain dyes and the like, with which the plates may be colored during post-treatment. The post-processed plates may be rinsed in water and then dried.

EXAMPLES

Now, the invention is described in more detail with reference to the following Examples, which, however, are not intended to restrict the scope of the invention.

Reference Example 1

14.5 g of 4-diazodiphenylamine sulfate was dissolved in 41.0 g of concentrated sulfuric acid with cooling with ice. 1.4 g of paraformaldehyde was gradually added to the reaction mixture, while the temperature of the mixture was kept at 10° C. or lower.

With cooling with ice, the reaction mixture was dropped into 500 ml of ethanol, and the resulting precipitate was taken out through filtration. This was washed with ethanol, and then dissolved in 100 ml of pure water, to which was added 20 g of a cold aqueous solution of 7.0 g of zinc chloride.

The resulting precipitate was taken out through filtration, then washed with ethanol, and dissolved in 150 ml of pure water, to which was added 20 g of a cold aqueous solution of 8.0 g of ammonium hexafluorophosphate. The resulting precipitate was taken out through filtration, washed with water, and dried to obtain diazo compound No. 1.

Reference Example 2

Chemical structures of the compounds used in the following Examples and Reference Examples are mentioned below.

Hydrogen-polysiloxane:

$(CH_3)_3SiO-(Si(CH_3)_2O\ )_{30}-(SiH(CH_3)O)_{10}-Si(CH_3)_3$ (In this, the structural units of $-Si(CH_3)_2O-$ and $-SiH(CH_3)O-$ are polymerized at random.)

Phosphorus Compound No. 1:

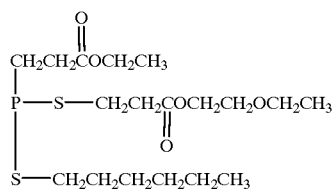

Phosphorus Compound No. 2:

$P(S-CH_2CH_2CH_2CH_2CH_2CH_3)_3$

Phosphorus Compound No. 3:

Example 1

A primer composition comprised of the components mentioned below was applied onto an aluminium plate having a thickness of 0.24 mm, the amount of the composition being to give a primer layer having a thickness of 7 μm after cured. Then, this was dried at 150° C. for 2 minutes, and cured by exposing it at 15 mW/cm², as measured with a UV meter (Oak Seisakusho's Light Measure Type UV365), for 5 minutes, using a 3 kW ultra-high pressure mercury lamp (of Oak Seisakusho).

| | | |
|---|---|---|
| (1) | Copolymer of 2-hydroxyethyl methacrylate/2-hydroxyethyl acrylate/methyl methacrylate/methyl acrylate = 20/20/30/30 (by mol) | 100 wt. pts. |
| (2) | Diazo compound No. 1 | 70 wt. pts. |
| (3) | Yellow pigment (KET-YELLOW 402, by Dai-Nippon Ink Chemical Industry) | 10 wt. pts. |
| (4) | White pigment (FINEX-25, by Sakai Chemical) | 20 wt. pts. |
| (5) | N,N-dimethylformamide | 250 wt. pts. |
| (6) | Tetrahydrofuran | 150 wt. pts. |

A photosensitive composition comprised of the following components was applied onto the primer layer, its amount being to give a dry thickness of 2 μm, and then dried at 120° C. for 1 minute to form a photosensitive layer on the primer layer.

| | | |
|---|---|---|
| (1) | 1,2,4,6-Tetra(2-hydroxy-3-methacryloxypropyl-oxy)-3,5-dihydroxyhexane | 15 wt. pts. |
| (2) | Product of 1 mol of m-xylylenediamine, 2 mols of glycidyl methacrylate and 2 mols of ethyl glycidyl ether | 15 wt. pts. |
| (3) | SAMPRENE IB1700D (polyurethane resin of Sanyo Chemical Industry) | 57 wt. pts. |
| (4) | Pentaerythritol diacrylate | 11 wt. pts. |
| (5) | 4,4'-(Diethylamino)benzophenone | 6 wt. pts. |
| (6) | 2-Chlorothioxanthone | 5.6 wt. pts. |
| (7) | Victoria Pure Blue B—OH 4-toluenesulfonate | 0.3 wt. pts. |
| (8) | MCF 323 (surfactant of Dai-Nippon Ink Chemical Industry) | 0.1 wt. pts. |
| (9) | N,N-dimethylformamide | 150 wt. pts. |
| (10) | Methyl ethyl ketone | 150 wt. pts. |

A silicone rubber composition comprised of the components mentioned below was applied onto the photosensitive layer, its at 120° C. for 2 minutes to form a silicone rubber layer on the photosensitive layer.

| | | |
|---|---|---|
| (1) | Polydimethylsiloxane terminated with hydroxyl groups at its both terminals (mean molecular weight: 50,000) | 100 wt. pts. |
| (2) | Methyltriacetoxysilane | 9.9 wt. pts. |
| (3) | Dibutyl tin dioctanoate | 0.1 wt. pts. |
| (4) | Hexane | 190 wt. pts. |
| (5) | Xylene | 50 wt. pts. |

A polyethylene terephthalate film (thickness: 6 μm) was laminated over the silicone rubber layer to be a protective layer. Thus was prepared a non-processed plate for waterless lithographic printing plates.

A positive, dot-image film having a plurality of different image areas at 150 lines/inch was air tightly contacted with this plate for 30 seconds, which was then exposed at 24 mW/cm², as measured with a UV meter (Oak Seisakusho's Light Measure Type UV365), for 3 minutes at 28° C., using a 3 kW ultra-high pressure mercury lamp (of Oak Seisakusho). After the exposure, the protective polyethylene terephthalate film was peeled off, and the plate was developed using an automatic developing machine, Torayls TWL-650. In the development, Toray's PP-F was used as the pre-processing solution, water as the developer, and Toray's PA-F as the post-processing solution. The thus-processed, waterless lithographic printing plate had good image reproducibility. The data are shown in Table 1 below.

Next, the non-processed plate as prepared in the same manner as above was stored in a thermostat kept at 50° C. for 1 month. The thus-stored plate was exposed and developed in the same manner as above to check its image reproducibility. This gave a waterless lithographic printing plate with good image reproducibility. The data are shown in Table 1.

To check its printing durability, the printing plate prepared herein was subjected to a printing test using a printer, LITHOPIA (by Mitsubishi Heavy Industries) in which was used printing ink of Dry Okaler Artist (by Dai-Nippon Ink Chemical Industry). This test verified good printing durability of the printing plate. The data are shown in Table 1.

Example 2

In the same manner as in Example 1 except that the composition of the photosensitive layer was changed to that mentioned below, prepared was a non-processed plate, which was evaluated in the same manner as in Example 1. The data are shown in Table 1.

| (1) | 1,2,4-Tri(2-hydroxy-3-acryloxypropyloxy)-3-acryloxy-5,6-dihydroxyhexane | 12 wt. pts. |
|---|---|---|
| (2) | Product of 1 mol of p-xylylenediamine, 2 mols of glycidyl methacrylate and 2 mols of methyl glycidyl ether | 15 wt. pts. |
| (3) | SAMPRENE IB1700D (polyurethane resin of Sanyo Chemical Industry) | 52 wt. pts. |
| (4) | Trimethylolpropane trimethacrylate | 9 wt. pts. |
| (5) | 4,4'-(Diethylamino)benzophenone | 6 wt. pts. |
| (6) | 2-Chlorothioxanthone | 5.6 wt. pts. |
| (7) | Victoria Pure Blue B—OH 4-toluenesulfonate | 0.3 wt. pts. |
| (8) | MCF 323 (surfactant of Dai-Nippon Ink Chemical Industry) | 0.1 wt. pts. |
| (9) | N,N-dimethylformamide | 150 wt. pts. |
| (10) | Methyl isobutyl ketone | 150 wt. pts. |

Example 3

In the same manner as in Example 1 except that the composition of the photosensitive layer was changed to that mentioned below, prepared was a non-processed plate, which was evaluated in the same manner as in Example 1. The data are shown in Table 1.

| (1) | 1,2,4-Tri(2-hydroxy-3-methacryloxypropyloxy)-3,5,6-trihydroxyhexane | 15 wt. pts. |
|---|---|---|
| (2) | Product of 1 mol of trioxypropylenediamine, 3 mols of glycidyl methacrylate and 1 mol of butyl glycidyl ether | 15 wt. pts. |
| (3) | MIRAKTON P22S (polyurethane resin of Nippon Polyurethane) | 55 wt. pts. |
| (4) | 1,6-Hexane diacrylate | 13 wt. pts. |
| (5) | 4,4'-(Diethylamino)benzophenone | 6 wt. pts. |
| (6) | 2,4-Diethylthioxanthone | 5.6 wt. pts. |
| (7) | Victoria Pure Blue B—OH benzenesulfonate | 0.3 wt. pts. |
| (8) | MCF 323 (surfactant of Dai-Nippon Ink Chemical Industry) | 0.1 wt. pts. |
| (9) | N,N-dimethylformamide | 150 wt. pts. |
| (10) | Tetrahydrofuran | 140 wt. pts. |

Comparative Example 1

In the same manner as in Example 1 except that the composition of the photosensitive layer was changed to that mentioned below, prepared was a non-processed plate, which was evaluated in the same manner as in Example 1. The data are shown in Table 1, which verify that the image reproducibility of the stored plate was poorer than that of the stored plates of Examples 1 to 3. In addition, the printing durability of the printing plate was also poorer than that of the printing plates of Examples 1 to 3.

| (1) | Product of 1 mol of m-xylylenediamine, 3 mols of glycidyl methacrylate and 1 mol of butyl glycidyl ether | 21 wt. pts. |
|---|---|---|
| (2) | SAMPRENE IB1700D (polyurethane resin of Sanyo Chemical Industry) | 56 wt. pts. |
| (3) | Pentaerythritol triacrylate | 11 wt. pts. |
| (4) | 4,4'-(Diethylamino)benzophenone | 6 wt. pts. |
| (5) | 2-Chlorothioxanthone | 5.6 wt. pts. |
| (6) | Victoria Pure Blue B—OH 4-toluenesulfonate | 0.3 wt. pts. |
| (7) | MCF 323 (surfactant of Dai-Nippon Ink Chemical Industry) | 0.1 wt. pts. |
| (8) | N,N-dimethylformamide | 150 wt. pts. |
| (9) | Methyl ethyl ketone | 150 wt. pts. |

Comparative Example 2

In the same manner as in Example 1 except that the composition of the photosensitive layer was changed to that mentioned below, prepared was a non-processed plate, which was evaluated in the same manner as in Example 1. The data are shown in Table 1, which verify that the image reproducibility of the stored plate was poorer than that of the stored plates of Examples 1 to 3.

| (1) | Product of 1 mol of trioxypropylenediamine, 3 mols of glycidyl methacrylate and 1 mol of butyl glycidyl ether | 20 wt. pts. |
|---|---|---|
| (2) | MIRAKTON P22S (polyurethane resin of Nippon Polyurethane) | 55 wt. pts. |
| (3) | 1,6-Hexane diacrylate | 13 wt. pts. |
| (4) | 4,4'-(Diethylamino)benzophenone | 6 wt. pts. |
| (5) | 2,4-Diethylthioxanthone | 5.6 wt. pts. |
| (6) | Victoria Pure Blue B—OH benzenesulfonate | 5.6 wt. pts. |
| (7) | MCF 323 (surfactant of Dai-Nippon Ink Chemical Industry) | 0.1 wt. pts. |
| (8) | N,N-dimethylformamide | 150 wt. pts. |
| (9) | Tetrahydrofuran | 140 wt. pts. |

Comparative Example 3

In the same manner as in Example 1 except that the composition of the photosensitive layer was changed to that mentioned below, prepared was a non-processed plate, which was evaluated in the same manner as in Example 1. The data are shown in Table 1, which verify that the printing durability of the printing plate was poorer than that of the printing plates of Examples 1 to 3.

| (1) | Pentaerythritol triacrylate | 15 wt. pts. |
|---|---|---|
| (2) | Product of 1 mol of trioxypropylenediamine, 3 mols of glycidyl methacrylate and 1 mol of butyl glycidyl ether | |
| (3) | MIRAKTON P22S (polyurethane resin of Nippon Polyurethane) | 15 wt. pts. |
| (4) | 1,6-Hexane diacrylate | 13 wt. pts. |
| (5) | 4,4'-(Diethylamino)benzophenone | 6 wt. pts. |
| (6) | 2,4-Diethylthioxanthone | 5.6 wt. pts. |
| (7) | Victoria Pure Blue B—OH benzenesulfonate | 0.3 wt. pts. |
| (8) | MCF 323 (surfactant of Dai-Nippon Ink Chemical Industry) | 0.1 wt. pts. |
| (9) | N,N-dimethylformamide | 150 wt. pts. |
| (10) | Tetrahydrofuran | 140 wt. pts. |

Example 4

In the same manner as in Example 1 except that the composition of the primer layer was changed to that mentioned below and that the primer layer was cured thermally at 200° C. for 2 minutes but not optically, prepared was a non-processed plate, which was evaluated in the same manner as in Example 1. The data are shown in Table 1.

| (1) | MIRAKTON P22S (polyurethane resin of Nippon Polyurethane) | 180 wt. pts. |
|---|---|---|
| (2) | Hexamethylene diisocyanate | 15 wt. pts. |
| (3) | Epoxy-phenol-urea resin, SJ9372 (by Kansai Paint) | 40 wt. pts. |
| (4) | Product of 1 mol of glycerin and 3 mols of epichlorohydrin | 25. wt. pts. |
| (5) | White pigment (FINEX-25, by Sakai Chemical) | 20 wt. pts. |
| (6) | N,N-dimethylformamide | 250 wt. pts. |
| (7) | Tetrahydrofuran | 20 wt. pts. |

Example 5

In the same manner as in Example 1 except that the composition of the silicone rubber layer was changed to that mentioned below, prepared was a non-processed plate, which was evaluated in the same manner as in Example 1. The data are shown in Table 1.

| | | |
|---|---|---|
| (1) | Polydimethylsiloxane terminated with hydroxyl groups at its both terminals | 100 wt. pts. |
| (2) | Hydrogenpolysiloxane | 9.7 wt. pts. |
| (3) | Chloroauric acid/methylvinylsiloxane cyclic complex | 0.3 wt. pts. |
| (4) | Hexane | 180 wt. pts. |
| (5) | Xylene | 50 wt. pts. |

Example 6

A primer composition comprised of the components mentioned below was applied onto an aluminium plate having a thickness of 0.24 mm, the amount of the composition being to give a primer layer having a thickness of 9 μm after cured. Then, this was dried at 150° C. for 2 minutes, and cured by exposing it at 12 mW/cm$^2$, as measured with a UV meter (Oak Seisakushols Light Measure Type UV365), for 10 minutes, using a 3 kW ultra-high pressure mercury lamp (of Oak Seisakusho).

| | | |
|---|---|---|
| (1) | Copolymer of 2-hydroxyethyl methacrylate/2-hydroxyethyl acrylate/methyl methacrylate/methyl acrylate = 20/20/30/30 (by mol) | 100 wt. pts. |
| (2) | Diazo compound No. 1 | 70 wt. pts. |
| (3) | Yellow pigment (KET-YELLOW 402, by Dai-Nippon Ink Chemical Industry) | 10 wt. pts. |
| (4) | White pigment (FINEX-25, by Sakai Chemical) | 20 wt. pts. |
| (5) | N,N-dimethylformamide | 250 wt. pts. |
| (6) | Tetrahydrofuran | 150 wt. pts. |

A photosensitive composition comprised of the following components was applied onto the primer layer, its amount being to give a dry thickness of 2 μm, and then dried at 120° C. for 1 minute to form a photosensitive layer on the primer layer.

| | | |
|---|---|---|
| (1) | 1,2,4,6-Tetra(2-hydroxy-3-methacryloxypropyl-oxy)-3,5-dihydroxyhexane | 15 wt. pts. |
| (2) | Product of 1 mol of m-xylylenediamine, 2 mols of glycidyl methacrylate and 2 mols of ethyl glycidyl ether | 15 wt. pts. |
| (3) | SAMPRENE IB1700D (polyurethane resin of Sanyo Chemical Industry) | 55 wt. pts. |
| (4) | Pentaerythritol diacrylate | 10 wt. pts. |
| (5) | 4,4'-(Diethylamino)benzophenone | 6 wt. pts. |
| (6) | 2-Chlorothioxanthone | 5.6 wt. pts. |
| (7) | Victoria Pure Blue B—OH 4-toluenesulfonate | 0.3 wt. pts. |
| (8) | MCF 323 (surfactant of Dai-Nippon Ink Chemical Industry) | 0.1 wt. pts. |
| (9) | Phosphorus compound No. 2 | 3 wt. pts. |
| (10) | N,N-dimethylformamide | 145 wt. pts. |
| (11) | Methyl ethyl ketone | 145 wt. pts. |

A silicone rubber composition comprised of the components mentioned below was applied onto the photosensitive layer, its amount being to give a dry thickness of 2 μm, and dried and cured at 120° C. for 2 minutes to form a silicone rubber layer on the photosensitive layer.

| | | |
|---|---|---|
| (1) | Polydimethylsiloxane terminated with hydroxyl groups at its both terminals (mean molecular weight: 50,000) | 100 wt. pts. |
| (2) | Methyltriacetoxysilane | 9.9 wt. pts. |
| (3) | Dibutyl tin dioctanoate | 0.1 wt. pts. |
| (4) | Hexane | 190 wt. pts. |
| (5) | Xylene | 50 wt. pts. |

A polyethylene terephthalate film (thickness: 6 Mm) was laminated over the silicone rubber layer to be a protective layer. Thus was prepared a non-processed plate for waterless lithographic printing plates.

A positive, dot-image film having a plurality of different image areas at 150 lines/inch was air tightly contacted with this plate for 30 seconds, which was then exposed at 24 mW/cm$^2$, as measured with a UV meter (Oak Seisakusho's Light Measure Type UV365), for 3 minutes at 28° C., using a 3 kW ultra-high pressure mercury lamp (of Oak Seisakusho). After the exposure, the protective polyethylene terephthalate film was peeled off, and the plate was developed using an automatic developing machine, Toray's TWL-650. In the development, TorayIs PP-F was used as the pre-processing solution, water as the developer, and Toray's PA-F as the post-processing solution. The thus-processed, waterless lithographic printing plate had good image reproducibility. The data are shown in Table 2 below.

Next, the same positive, dot-image film as above was air tightly contacted with the non-processed plate as prepared in the same manner as above, for 30 seconds, and this was then exposed at 24 mW/cm$^2$, as measured with a UV meter (Oak Seisakusho's Light Measure Type UV365), for 3 minutes at 15° C., using a 3 kw ultra-high pressure mercury lamp (of Oak Seisakusho). After the exposure, the protective polyethylene terephthalate film was peeled off, and the plate was developed using an automatic developing machine, Toray's TWL-650. In the development, Toray's PP-F was used as the pre-processing solution, water as the developer, and Toray's PA-F as the post-processing solution. The thus-processed, waterless lithographic printing plate had good image reproducibility. The data are shown in Table 2.

Next, the non-processed plate as prepared in the same manner as above was stored in a thermostat kept at 50° C. for 1 month. The thus-stored plate was exposed and developed in the same manner as above to check its image reproducibility. This gave a waterless lithographic printing plate with good image reproducibility. The data are shown in Table 2.

To check their printing durability, the printing plates prepared herein were subjected to a printing test using a printer, LITHOPIA (by Mitsubishi Heavy Industries) in which was used printing ink of Dry Okaler Artist (by Dai-Nippon Ink Chemical Industry). This test verified good printing durability of the printing plates. The data are shown in Table 2.

Example 7

In the same manner as in Example 6 except that the composition of the photosensitive layer was changed to that mentioned below, prepared was a non-processed plate, which was evaluated in the same manner as in Example 6.

The data are shown in Table 2.

| | | |
|---|---|---|
| (1) | 1,2,4-Tri(2-hydroxy-3-acryloxypropyloxy)-3-acryloxy-5,6-dihydroxyhexane | 12 wt. pts. |
| (2) | Product of 1 mol of p-xylylenediamine, 3 mols of glycidyl methacrylate and 1 mol of methyl glycidyl ether | 14 wt. pts. |
| (3) | SAMPRENE IB1700D (polyurethane resin of Sanyo Chemical Industry) | 51 wt. pts. |
| (4) | Pentaerythritol tetramethacrylate | 8 wt. pts. |
| (5) | 4,4'-(Diethylamino)benzophenone | 6 wt. pts. |
| (6) | 2-Chlorothioxanthone | 5.6 wt. pts. |
| (7) | Victoria Pure Blue B—OH 4-toluenesulfonate | 0.3 wt. pts. |
| (8) | MCF 323 (surfactant of Dai-Nippon Ink Chemical Industry) | 0.1 wt. pts. |
| (9) | Phosphorus compound No. 3 | 3 wt. pts. |
| (10) | N,N-dimethylformamide | 150 wt. pts. |
| (11) | Methyl isobutyl ketone | 150 wt. pts. |

Example 8

In the same manner as in Example 6 except that the composition of the photosensitive layer was changed to that mentioned below, prepared was a non-processed plate, which was evaluated in the same manner as in Example 6. The data are shown in Table 2.

| | | |
|---|---|---|
| (1) | 1,2,3-Tri(2-hydroxy-3-methacryloxypropyloxy)-4,5,6-trihydroxyhexane | 16 wt. pts. |
| (2) | Product of 1 mol of tetraoxypropylenediamine, 3 mols of glycidyl methacrylate and 1 mol of butyl glycidyl ether | 16 wt. pts. |
| (3) | MIRAKTON P22S (polyurethane resin of Nippon Polyurethane) | 57 wt. pts. |
| (4) | 1,6-Octane diacrylate | 14 wt. pts. |
| (5) | 4,4'-(Diethylamino)benzophenone | 6 wt. pts. |
| (6) | 2,4-Diethylthioxanthone | 5.6 wt. pts. |
| (7) | Victoria Pure Blue B—OH benzenesulfonate | 0.3 wt. pts. |
| (8) | MCF 323 (surfactant of Dai-Nippon Ink Chemical Industry) | 0.1 wt. pts. |
| (9) | Phosphorus compound No. 1 | 5 wt. pts. |
| (10) | N,N-dimethylformamide | 140 wt. pts. |
| (11) | Tetrahydrofuran | 140 wt. pts. |

Comparative Example 4

In the same manner as in Example 6 except that the composition of the photosensitive layer was changed to that mentioned below, prepared was a non-processed plate, which was evaluated in the same manner as in Example 6. The data are shown in Table 2, which verify that the image reproducibility of the plates exposed at a low temperature and that of the stored plates were poor. In addition, the printing durability of the printing plates was also poor.

| | | |
|---|---|---|
| (1) | Product of 1 mol of m-xylylenediamine, 3 mols of glycidyl methacrylate and 1 mol of butyl glycidyl ether | 22 wt. pts. |
| (2) | SAMPRENE IB1700D (polyurethane resin of Sanyo Chemical Industry) | 56 wt. pts. |
| (3) | Pentaerythritol triacrylate | 10 wt. pts. |
| (4) | 4,4'-(Diethylamino)benzophenone | 6 wt. pts. |
| (5) | 2-Chlorothioxanthone | 5.6 wt. pts. |
| (6) | Victoria Pure Blue B—OH 4-toluenesulfonate | 0.3 wt. pts. |
| (7) | MCF 323 (surfactant of Dai-Nippon Ink Chemical Industry) | 0.1 wt. pts. |
| (8) | N,N-dimethylformamide | 150 wt. pts. |
| (9) | Methyl ethyl ketone | 150 wt. pts. |

Comparative Example 5

In the same manner as in Example 6 except that the composition of the photosensitive layer was changed to that mentioned below, prepared was a non-processed plate, which was evaluated in the same manner as in Example 6. The data are shown in Table 2, which verify that the image reproducibility of the plates exposed at a low temperature and that of the stored plates were poor.

| | | |
|---|---|---|
| (1) | Product of 1 mol of trioxypropylenediamine, 3 mols of glycidyl methacrylate and 1 mol of butyl glycidyl ether | 20 wt. pts. |
| (2) | MIRAKTON P22S (polyurethane resin of Nippon Polyurethane) | 55 wt. pts. |
| (3) | 1,8-Pentane diacrylate | 13 wt. pts. |
| (4) | 4,4'-(Diethylamino)benzophenone | 6 wt. pts. |
| (5) | 2,4-Diethylthioxanthone | 5.6 wt. pts. |
| (6) | Victoria Pure Blue B—OH benzenesulfonate | 0.3 wt. pts. |
| (7) | MCF 323 (surfactant of Dai-Nippon Ink Chemical Industry) | 0.1 wt. pts. |
| (8) | N,N-dimethylformamide | 150 wt. pts. |
| (9) | Tetrahydrofuran | 140 wt. pts. |

Comparative Example 6

In the same manner as in Example 6 except that the composition of the photosensitive layer was changed to that mentioned below, prepared was a non-processed plate, which was evaluated in the same manner as in Example 6. The data are shown in Table 2, which verify that image reproducibility of the stored plates was poor. In addition, the printing durability of the printing plates was also poor.

| | | |
|---|---|---|
| (1) | Product of 1 mol of m-xylylenediamine, 2 mols of glycidyl methacrylate and 2 mols of butyl glycidyl ether | 25 wt. pts. |
| (2) | SAMPRENE IB1700D (polyurethane resin of Sanyo Chemcial Industry) | 55 wt. pts. |
| (3) | Pentaerythritol triacrylate | 15 wt. pts. |
| (4) | 4,4'-(Diethylamino)benzophenone | 6 wt. pts. |
| (5) | 2-Chlorothioxanthone | 5.6 wt. pts. |
| (6) | Victoria Pure Blue B—OH 4-toluenesulfonate | 0.3 wt. pts. |
| (7) | MCF 323 (surfactant of Dai-Nippon Ink Chemical Industry) | 0.1 wt. pts. |
| (8) | Phosphorus compound No. 2 | 3 wt. pts. |
| (9) | N,N-dimethylformamide | 145 wt. pts. |
| (10) | Methyl ethyl ketone | 145 wt. pts. |

Example 9

In the same manner as in Example 6 except that the composition of the primer layer was changed to that mentioned below and that the primer layer was cured thermally at 200° C. for 2 minutes but not optically, prepared was a non-processed plate, which was evaluated in the same manner as in Example 6. The data shown in Table 2.

| (1) | MIRAKTON P22S (polyurethane resin of Nippon Polyurethane) | 180 wt. pts. |
|---|---|---|
| (2) | Hexamethylene diisocyanate | 15 wt. pts. |
| (3) | Epoxy-phenol-urea resin, SJ9372 (by Kansai Paint) | 40 wt. pts. |
| (4) | Product of 1 mol of glycerin and 3 mols of epichlorohydrin | 25 wt. pts. |
| (5) | White pigment (FINEX-25, by Sakai Chemical) | 20 wt. pts. |
| (6) | N,N-dimethylformamide | 250 wt. pts. |
| (7) | Tetrahydrofuran | 20 wt. pts. |

Example 10

In the same manner as in Example 6 except that the composition of the silicone rubber layer was changed to that mentioned below, prepared was a non-processed plate, which was evaluated in the same manner as in Example 6. The data are shown in Table 2.

| (1) | Polydimethylsiloxane terminated with hydroxyl groups at its both terminals (mean molecular weight: 50,000) | 100 wt. pts. |
|---|---|---|
| (2) | Hydrogenpolysiloxane | 9.7 wt. pts. |
| (3) | Chloroauric acid/methylvinylsiloxane cyclic complex | 0.3 wt. pts. |
| (4) | Hexane | 180 wt. pts. |
| (5) | Xylene | 50 wt. pts. |

Example 11

In the same manner as in Example 6 except that the composition of the photosensitive layer was changed to that mentioned below, prepared was a non-processed plate, which was evaluated in the same manner as in Example 6. The data are shown in Table 2.

| (1) | 1,2,5,6-Tetra(2-hydroxy-3-methacryloxypropyloxy)-3,4-dihydroxyhexane | 15 wt. pts. |
|---|---|---|
| (2) | Product of 1 mol of m-xylylenediamine, 2 mols of glycidyl methacrylate and 2 mols of butyl glycidyl ether | 10 wt. pts. |
| (3) | Product of 1 mol of m-xylylenediamine, 2 mols of glycidyl methacrylate, 1 mol of butyl glycidyl ether and 1 mol of 3-glycidoxypropyltrimethoxysilane | 5 wt. pts. |
| (4) | SAMPRENE IB1700D (polyurethane resin by Sanyo Chemical Industry) | 55 wt. pts. |
| (5) | Pentaerythritol triacrylate | 10 wt. pts. |
| (6) | 4,4'-(Diethylamino)benzophenone | 6 wt. pts. |
| (7) | 2-Chlorothioxanthone | 5.6 wt. pts. |
| (8) | Victoria Pure Blue B—OH 4-toluenesulfonate | 0.3 wt. pts. |
| (9) | MCF 323 (surfactant of Dai-Nippon Ink Chemical Industry) | 0.1 wt. pts. |
| (10) | Phosphorus compound No. 2 | 3 wt. pts. |
| (11) | N,N-dimethylformamide | 145 wt. pts. |
| (12) | Methyl ethyl ketone | 145 wt. pts. |

Example 12

In the same manner as in Example 6 except that the composition of the photosensitive layer was changed to that mentioned below, prepared was a non-processed plate, which was evaluated in the same manner as in Example 6. The data are shown in Table 2.

| (1) | 1,2,5-Tri(2-hydroxy-3-methacryloxypropyloxy)-3,4,6-trihydroxyhexane | 16 wt. pts. |
|---|---|---|
| (2) | Product of 1 mol of tetraoxypropylenediamine, 3 mols of glycidyl methacrylate and 1 mol of butyl glycidyl ether | 12 wt. pts. |
| (3) | Product of 1 mol of tetraoxypropylenediamine, 2 mols of glycidyl methacrylate, 1 mol of butyl glycidyl ether and 1 mol of 3-glycidoxypropyltriethoxysilane | 4 wt. pts. |
| (4) | MIRAKTON (polyurethane resin of Nippon Polyurethane) | 57 wt. pts. |
| (5) | 1,8-Octane diacrylate | 14 wt. pts. |
| (6) | 4,4'-(Diethylamino)benzophenone | 6 wt. pts. |
| (7) | 2,4-Diethylthioxanthone | 5.6 wt. pts. |
| (8) | Victoria Pure Blue B—OH benzenesulfonate | 0.3 wt. pts. |
| (9) | MCF 323 (surfactant of Dai-Nippon Ink Chemical Industry) | 0.1 wt. pts. |
| (10) | Phosphorus compound No. 1 | 5 wt. pts. |
| (11) | N,N-dimethylformamide | 140 wt. pts. |
| (12) | Tetrahydrofuran | 140 wt. pts. |

Example 13

In the same manner as in Example 6 except that the composition of the photosensitive layer was changed to that mentioned below, prepared was a non-processed plate, which was evaluated in the same manner as in Example 6. The data are shown in Table 2.

| (1) | 1,2,4-Tri(2-hydroxy-3-acryloxypropyloxy)-3-acryloxy-5,6-dihydroxyhexane | 8 wt. pts. |
|---|---|---|
| (2) | Product of 1 mol of 1,2,4-tri(2-hydroxy-3-acryloxypropyloxy)-3-acryloxy-5,6-dihydroxyhexane and 1 mol of ethyltriacetoxysilane | 4 wt. pts. |
| (3) | Product of 1 mol of p-xylylenediamine, 3 mols of glycidyl methacrylate and 1 mol of methyl glycidyl ether | 14 wt. pts. |
| (4) | SAMPRENE IB1700D (polyurethane resin of Sanyo Chemical Industry) | 51 wt. pts. |
| (5) | Pentaerythritol tetramethacrylate | 8 wt. pts. |
| (6) | 4,4'-(Diethylamino)benzophenone | 6 wt. pts. |
| (7) | 2-Chlorothioxanthone | 5.6 wt. pts. |
| (8) | Victoria Pure Blue B—OH benzenesulfonate | 0.3 wt. pts. |
| (9) | MCF 323 (surfactant of Dai-Nippon Ink Chemical Industry) | 0.1 wt. pts. |
| (10) | Phosphorus compound No. 3 | 3 wt. pts. |
| (11) | N,N-dimethylformamide | 150 wt. pts. |
| (12) | Methyl isobutyl ketone | 150 wt. pts. |

Example 14

A primer composition comprised of the components mentioned below was applied onto an aluminium plate having a thickness of 0.24 mm, the amount of the composition being to give a primer layer having a thickness of 7 Mm after cured. Then, this was dried at 160° C. for 2 minutes, and cured by exposing it at 15 mW/cm$^2$, as measured with a UV meter (Oak Seisakusho's Light Measure Type UV365), for 5 minutes, using a 3 kW ultra-high pressure mercury lamp (of Oak Seisakusho).

| (1) | Copolymer of 2-hydroxyethyl methacrylate/2-hydroxyethyl acrylate/methyl methacrylate/methyl acrylate = 20/20/30/30 (by mol) | 100 wt. pts. |
|---|---|---|
| (2) | Diazo compound No. 1 | 70 wt. pts. |

-continued

| | | |
|---|---|---|
| (3) | Yellow pigment (KET-YELLOW 402, by Dai-Nippon Ink Chemical Industry) | 10 wt. pts. |
| (4) | White pigment (FINEX-25, by Sakai Chemical) | 20 wt. pts. |
| (5) | N,N-dimethylformamide | 250 wt. pts. |
| (6) | Tetrahydrofuran | 150 wt. pts. |

A photosensitive composition comprised of the following components was applied onto the primer layer, its amount being to give a dry thickness of 3 μm, and then dried at 130° C. for 1 minute to form a photosensitive layer on the primer layer.

| | | |
|---|---|---|
| (1) | 1,2,5,6-Tetra(2-hydroxy-3-methacryloxypropyl-oxy)-3,4-dihydroxyhexane | 13 wt. pts. |
| (2) | Product of 1 mol of m-xylylenediamine, 2 mols of glycidyl methacrylate and 2 mols of ethyl glycidyl ether | 13 wt. pts. |
| (3) | SAMPRENE 1B1700D (polyurethane resin of Sanyo Chemcial Industry) | 56 wt. pts. |
| (4) | Pentaerythritol diacrylate | 13 wt. pts. |
| (5) | 4,4'-(Diethylamino)benzophenone | 6 wt. pts. |
| (6) | 2-Chlorothioxanthone | 5.6 wt. pts. |
| (7) | Victoria Pure Blue B—OH 4-toluenesulfonate | 0.3 wt. pts. |
| (8) | MCF 323 (surfactant of Dai-Nippon Ink Chemical Industry) | 0.1 wt. pts. |
| (9) | Phosphorus compound No. 2 | 3 wt. pts. |
| (10) | N,N-dimethylformamide | 100 wt. pts. |
| (11) | Methyl ethyl ketone | 50 wt. pts. |
| (12) | Methyl ethyl ketone | 140 wt. pts. |

A silicone rubber composition comprised of the components mentioned below was applied onto the photosensitive layer, its amount being to give a dry thickness of 2 μm, and dried and cured at 130° C. for 2 minutes to form a silicone rubber layer on the photosensitive layer.

| | | |
|---|---|---|
| (1) | Polydimethylsiloxane terminated with hydroxyl groups at its both terminals (mean molecular weight: 50,000) | 100 wt. pts. |
| (2) | Tetracetoxysilane | 6.9 wt. pts. |
| (3) | Dibutyl tin dioctanoate | 0.1 wt. pts. |
| (4) | Hexane | 193 wt. pts. |
| (5) | Xylene | 50 wt. pts. |

A coating liquid comprised of the following components was applied onto a polyethylene terephthalate film (thickness: 6 μm), its amount being to give a dry thickness of 1 μm. The thus-coated film was laminated over the silicone rubber layer, with its non-coated surface facing the silicone rubber layer, to be a protective layer. Thus was prepared a non-processed plate for waterless lithographic printing plates.

| | | |
|---|---|---|
| (1) | Saturated polyester resin (Toyo Spinning's Bailon 200, having a refractive index of 1.58) | 100 wt. pts. |
| (2) | Natural silica (by Shiraishi Industry; this has a mean grain size, as measured according to the Coulter counter method, of 4.5μ, while containing small grains having a grain size of not larger than 2μ in an amount of not larger than 20% by weight and large grains having a grain size of not smaller than 20μ in an amount of not larger than 10% by weight, and has a refractive index of 1.58) | 6 wt. pts. |
| (3) | Diazo compound No. 1 | 2 wt. pts. |
| (4) | Toluene | 221 wt. pts. |
| (5) | Methyl ethyl ketone | 221 wt. pts. |

A positive, dot-image film having a plurality of different image areas at 150 lines/inch was air tightly contacted with this plate for 30 seconds, which was then exposed at 24 mW/cm$^2$, as measured with a UV meter (Oak Seisakusho's Light Measure Type UV365), for 3 minutes at 28° C., using a 3 kW ultra-high pressure mercury lamp (of Oak Seisakusho). After the exposure, the protective polyethylene terephthalate film was peeled off, and the plate was developed using an automatic developing machine, Toray's TWL-650. In the development, Toray's PP-F was used as the pre-processing solution, water as the developer, and Toray's PA-F as the post-processing solution. The thus-processed, waterless lithographic printing plate had good image reproducibility. The data are shown in Table 3 below.

Next, the same positive, dot-image film as above was air tightly contacted with the non-processed plate as prepared in the same manner as above, for 30 seconds, and this was then exposed at 24 mW/cm$^2_1$, as measured with a UV meter (Oak Seisakusho's Light Measure Type UV365), for 3 minutes at 15° C., using a 3 kw ultra-high pressure mercury lamp (of Oak Seisakusho). After the exposure, the protective polyethylene terephthalate film was peeled off, and the plate was developed using an automatic developing machine, Toray's TWL-650. In the development, Toray's PP-F was used as the pre-processing solution, water as the developer, and Toray's PA-F as the post-processing solution. The thus-processed, waterless lithographic printing plate had good image reproducibility. The data are shown in Table 3.

Next, the non-processed plate as prepared in the same manner as above was stored in a room while being exposed to an anti-fading light (80W) for 1 hour. Then, this was then exposed at 24 mW/cm$^2$, as measured with a UVmeter (Oak Seisakusho's Light Measure Type UV365), for 3 minutes at 28° C., using a 3 kW ultra-high pressure mercury lamp (of Oak Seisakusho). After the exposure, the protective polyethylene terephthalate film was peeled off, and the plate was developed using an automatic developing machine, Toray's TWL-650. In the development, Toray's PP-F was used as the pre-processing solution, water as the developer, and Toray's PA-F as the post-processing solution. The thus-processed, waterless lithographic printing plate had good image reproducibility. The data are shown in Table 3.

Next, the non-processed plate as prepared in the same manner as above was stored in a thermostat kept at 50° C. for 1 month. The thus-stored plate was exposed and developed in the same manner as above to check its image reproducibility. This gave a waterless lithographic printing plate with good image reproducibility. The data are shown in Table 4.

To check their printing durability, the printing plates prepared herein were subjected to a printing test using a printer, LITHOPIA (by Mitsubishi Heavy Industries) in which was used printing ink of Dry Okaler Artist (by Dai-Nippon Ink Chemical Industry). This test verified good printing durability of the printing plates. The data are shown in Tables 3 and 4.

Example 15

In the same manner as in Example 14 except that the composition of the photosensitive layer was changed to that mentioned below, prepared was a non-processed plate, which was evaluated in the same manner as in Example 14. The data are shown in Tables 3 and 4.

| | | |
|---|---|---|
| (1) | 1,2,4-Tri(2-hydroxy-3-acryloxypropyloxy)-3-acryloxy-5,6-dihydroxyhexane | 12 wt. pts. |
| (2) | Product of 1 mol of p-xylylenediamine, 3 mols of glycidyl methacrylate and 1 mol of methyl glycidyl ether | 14 wt. pts. |
| (3) | SAMPRENE IB1700D (polyurethane resin of Sanyo Chemical Industry) | 51 wt. pts. |
| (4) | Pentaerythritol tetramethacrylate | 8 wt. pts. |
| (5) | 4,4'-(Diethylamino)benzophenone | 6 wt. pts. |
| (6) | 2-Chlorothioxanthone | 5.6 wt. pts. |
| (7) | Victoria Pure Blue B—OH 4-toluenesulfonate | 0.3 wt. pts. |
| (8) | MCF 323 (surfactant of Dai-Nippon Ink Chemical Industry) | 0.1 wt. pts. |
| (9) | Phosphorus compound No. 3 | 3 wt. pts. |
| (10) | N,N-dimethylformamide | 150 wt. pts. |
| (11) | Methyl isobutyl ketone | 150 wt. pts. |

Example 16

In the same manner as in Example 14 except that the composition of the photosensitive layer was changed to that mentioned below, prepared was a non-processed plate, which was evaluated in the same manner as in Example 14. The data are shown in Tables 3 and 4.

| | | |
|---|---|---|
| (1) | 1,2,3-Tri(2-hydroxy-3-methacryloxypropyloxy)-4,5,6-trihydroxyhexane | 16 wt. pts. |
| (2) | Product of 1 mol of tetraoxypropylenediamine, 3 mols of glycidyl methacrylate and 1 mol of butyl glycidyl ether | 16 wt. pts. |
| (3) | MIRAKTON P22S (polyurethane resin of Nippon Polyurethane) | 57 wt. pts. |
| (4) | 1,8-Octane diacrylate | 14 wt. pts. |
| (5) | 4,4'-(Diethylamino)benzophenone | 6 wt. pts. |
| (6) | 2,4-Diethylthioxanthone | 5.6 wt. pts. |
| (7) | Victoria Pure Blue B—OH benzenesulfonate | 0.3 wt. pts. |
| (8) | MCF 323 (surfactant of Dai-Nippon Ink Chemical Industry) | 0.1 wt. pts. |
| (9) | Phosphorus compound No. 3 | 5 wt. pts. |
| (10) | N,N-dimethylformamide | 140 wt. pts. |
| (11) | Tetrahydrofuran | 140 wt. pts. |

Example 17

A non-processed plate was prepared in the same manner as in Example 14 except for the protective layer formed thereon. Precisely, in this, a coating liquid comprised of the following components was applied onto a polypropylene film (thickness: 6 $\mu$m), its amount being to give a dry thickness of 1 $\mu$m, and the thus-coated film was laminated over the silicone rubber layer. The plate prepared herein was evaluated in the same manner as in Example 14. The data are shown in Tables 3 and

| | | |
|---|---|---|
| (1) | Polyurethane (Sanyo Chemical Industry's SAMPRENE SZ-18 having a refractive index of 1.53) | 90 wt. pts. |
| (2) | Siloid 63 (by Fuji Devison Chemical; this has a mean grain size, as measured according to the Coulter counter method, of 6$\mu$, while containing small grains having a grain size of not larger than 2$\mu$ and large grains having a grain size of not smaller than 20$\mu$ in an amount of not larger than | 8 wt. pts. |

-continued

| | | |
|---|---|---|
| | 10% by weight, and has a refractive index of 1.46) | |
| (3) | E-5-dicyanomethylene-4-dicyclopropylmethylene[1-(2,5-dimethyl-3-furyl)ethylidene]tetrahydrofuran-2-one | 2 wt. pts. |
| (4) | N,N-dimethylformamide | 150 wt. pts. |
| (5) | Methyl isobutyl ketone | 150 wt. pts. |

Example 18

A non-processed plate was prepared in the same manner as in Example 14 except that a coating liquid comprised of the following components was used to form the protective layer. The plate prepared herein was evaluated in the same manner as in Example 14. The data are shown in Tables 3 and 4.

| | | |
|---|---|---|
| (1) | Polyurethane (Sanyo Chemical Industry's SAMPRENE SZ-18 having a refractive index of 1.53) | 90 wt. pts. |
| (2) | Siloid 63 (by Fuji Devison Chemical; this has a mean grain size, as measured according to the Coulter counter method, of 6$\mu$, while containing small grains having a grain size of not larger than 2$\mu$ and large grains having a grain size of not smaller than 20$\mu$ in an amount of not larger than 10% by weight, and has a refractive index of 1.46) | 8 wt. pts. |
| (3) | 4-Morpholino-2,5-dibutoxybenzene-diazonium hexafluorophosphate | 2 wt. pts. |
| (4) | N,N-dimethylformamide | 150 wt. pts. |
| (5) | Methyl isobutyl ketone | 150 wt. pts. |

Comparative Example 7

In the same manner as in Example 14 except that the composition of the photosensitive layer was changed to that mentioned below, prepared was a non-processed plate, which was evaluated in the same manner as in Example 14. The data are shown in Tables 3 and 4, which verify that the image reproducibility of the plates exposed at a low temperature and that of the stored plates were poor. In addition, the printing durability of the printing plates was also poor.

| | | |
|---|---|---|
| (1) | Product of 1 mol of m-xylenediamine, 3 mols of glycidyl methacrylate and 1 mol of butyl glycidyl ether | 22 wt. pts. |
| (2) | SAMPRENE IB1700D (polyurethane resin of Sanyo Chemical Industry) | 56 wt. pts. |
| (3) | Pentaerythritol triacrylate | 10 wt. pts. |
| (4) | 4,4'-(Diethylamino)benzophenone | 6 wt. pts. |
| (5) | 2-Chlorothioxanthone | 5.6 wt. pts. |
| (6) | Victoria Pure Blue B—OH 4-toluenesulfonate | 0.3 wt. pts. |
| (7) | MCF 323 (surfactant of Dai-Nippon Ink Chemical Industry) | 0.1 wt. pts. |
| (8) | N,N-dimethylformamide | 150 wt. pts. |
| (9) | Methyl ethyl ketone | 150 wt. pts. |

Comparative Example 8

In the same manner as in Example 14 except that the composition of the photosensitive layer was changed to that mentioned below, prepared was a non-processed plate, which was evaluated in the same manner as in Example 14. The data are shown in Tables 3 and 4, which verify that the image reproducibility of the plates exposed at a low temperature and that of the stored plates were poor.

| | | |
|---|---|---|
| (1) | Product of 1 mol of trioxypropylenediamine, 3 mols of glycidyl methacrylate and 1 mol of butyl glycidyl ether | 20 wt. pts. |
| (2) | MIRAKTON P22S (polyurethane resin of Nippon Polyurethane) | 55 wt. pts. |
| (3) | 1,8-Pentane diacrylate | 13 wt. pts. |
| (4) | 4,4'-(Diethylamino)benzophenone | 6 wt. pts. |
| (5) | 2,4-Diethylthioxanthone | 5.6 wt. pts. |
| (6) | Victoria Pure Blue B—OH benzenesulfonate | 0.3 wt. pts. |
| (7) | MCF 323 (surfactant of Dai-Nippon Ink Chemical Industry) | 0.1 wt. pts. |
| (8) | N,N-dimethylformamide | 150 wt. pts. |
| (9) | Tetrahydrofuran | 140 wt. pts. |

Comparative Example 9

In the same manner as in Example 14 except that the composition of the photosensitive layer was changed to that mentioned below, prepared was a non-processed plate, which was evaluated in the same manner as in Example 14. The data are shown in Tables 3 and 4, which verify that the image reproducibility of the stored plates was poor. In addition, the printing durability of the printing plates was also poor.

| | | |
|---|---|---|
| (1) | Product of 1 mol of m-xylylenediamine, 2 mols of glycidyl methacrylate and 2 mols of butyl glycidyl ether | 25 wt. pts. |
| (2) | SAMPRENE IB1700D (polyurethane resin of Sanyo Chemical Industry) | 55 wt. pts. |
| (3) | Pentaerythritol triacrylate | 15 wt. pts. |
| (4) | 4,4'-(Diethylamino)benzophenone | 6 wt. pts. |
| (5) | 2-Chlorothioxanthone | 5.6 wt. pts. |
| (6) | Victoria Pure Blue B—OH 4-toluenesulfonate | 0.3 wt. pts. |
| (7) | MCF 323 (surfactant of Dai-Nippon Ink Chemical Industry) | 0.1 wt. pts. |
| (8) | Phosphorus compound No. 2 | 3 wt. pts. |
| (9) | N,N-dimethylformamide | 145 wt. pts. |
| (10) | Methyl ethyl ketone | 145 wt. pts. |

Example 19

In the same manner as in Example 14 except that the composition of the primer layer was changed to that mentioned below and that the primer layer was cured thermally at 200° C. for 2 minutes but not optically, prepared was a non-processed plate, which was evaluated in the same manner as in Example 14. The data are shown in Tables 3 and 4.

| | | |
|---|---|---|
| (1) | MIRAKTON P22S (polyurethane resin of Nippon Polyurethane) | 180 wt. pts. |
| (2) | Hexamethylene diisocyanate | 15 wt. pts. |
| (3) | Epoxy-phenol-urea resin, SJ9372 (by Kansai Paint) | 40 wt. pts. |
| (4) | Product of 1 mol of glycerin and 3 mols of epichlorohydrin | 25. wt. pts. |
| (5) | White pigment (FINEX-25, by Sakai Chemical) | 20 wt. pts. |
| (6) | N,N-dimethylformamide | 250 wt. pts. |
| (7) | Tetrahydrofuran | 20 wt. pts. |

Example 20

In the same manner as in Example 14 except that the composition of the silicone rubber layer was changed to that mentioned below, prepared was a non-processed plate, which was evaluated in the same manner as in Example 14. The data are shown in Tables 3 and 4.

| | | |
|---|---|---|
| (1) | Polydimethylsiloxane terminated with hydroxyl groups at its both terminals (mean molecular weight: 50,000) | 100 wt. pts. |
| (2) | Hydrogenpolysiloxane | 9.7 wt. pts. |
| (3) | Chloroauric acid/methylvinylsiloxane cyclic complex | 0.3 wt. pts. |
| (4) | Hexane | 180 wt. pts. |
| (5) | Xylene | 50 wt. pts. |

Example 21

In the same manner as in Example 14 except that the composition of the photosensitive layer was changed to that mentioned below, prepared was a non-processed plate, which was evaluated in the same manner as in Example 14. The data are shown in Tables 3 and 4.

| | | |
|---|---|---|
| (1) | 1,2,5,6-Tetra(2-hydroxy-3-methacryloxypropyl-oxy)-3,4-dihydroxyhexane | 15 wt. pts. |
| (2) | Product of 1 mol of m-xylylenediamine, 2 mols of glycidyl methacrylate and 2 mols of butyl glycidyl ether | 10 wt. pts. |
| (3) | Product of 1 mol of m-xylylenediamine, 2 mols of glycidyl methacrylate, 1 mol of butyl glycidyl ether and 1 mol of 3-glycidoxypropyltri-methoxysilane | 5 wt. pts. |
| (4) | SAMPRENE IB1700D (polyurethane resin by Sanyo Chemcial Industry) | 55 wt. pts. |
| (5) | Pentaerythritol triacrylate | 10 wt. pts. |
| (6) | 4,4'-(Diethylamino)benzophenone | 6 wt. pts. |
| (7) | 2-Chlorothioxanthone | 5.6 wt. pts. |
| (8) | Victoria Pure Blue B—OH 4-toluenesulfonate | 0.3 wt. pts. |
| (9) | MCF 323 (surfactant of Dai-Nippon Ink Chemical Industry) | 0.1 wt. pts. |
| (10) | Phosphorus compound No. 2 | 3 wt. pts. |
| (11) | N,N-dimethylformamide | 145 wt. pts. |
| (12) | Methyl ethyl ketone | 145 wt. pts. |

Example 22

In the same manner as in Example 14 except that the composition of the photosensitive layer was changed to that mentioned below, prepared was a non-processed plate, which was evaluated in the same manner as in Example 14. The data are shown in Tables 3 and 4.

| | | |
|---|---|---|
| (1) | 1,2,5-Tri(2-hydroxy-3-methacryloxypropyloxy)-3,4,6-trihydroxyhexane | 16 wt. pts. |
| (2) | Product of 1 mol of tetraoxypropylenediamine, 3 mols of glycidyl methacrylate and 1 mol of butyl glycidyl ether | 12 wt. pts. |
| (3) | Product of 1 mol of tetraoxypropylenediamine, 2 mols of glycidyl methacrylate, 1 mol of butyl glycidyl ether and 1 mol of 3-glycidoxypropyl-triethoxysilane | 4 wt. pts. |
| (4) | MIRAKTON (polyurethane resin of Nippon Polyurethane) | 57 wt. pts. |
| (5) | 1,8-Octane diacrylate | 14 wt. pts. |
| (6) | 4,4'-(Diethylamino)benzophenone | 6 wt. pts. |
| (7) | 2,4-Diethylthioxanthone | 5.6 wt. pts. |
| (8) | Victoria Pure Blue B—OH benzenesulfonate | 0.3 wt. pts. |
| (9) | MCF 323 (surfactant of Dai-Nippon Ink Chemical Industry) | 0.1 wt. pts. |

| | |
|---|---|
| (10) Phosphorus compound No. 1 | 5 wt. pts. |
| (11) N,N-dimethylformamide | 140 wt. pts. |
| (12) Tetrahydrofuran | 140 wt. pts. |

Example 23

In the same manner as in Example 14 except that the composition of the photosensitive layer was changed to that mentioned below, prepared was a non-processed plate, which was evaluated in the same manner as in Example 14. The data are shown in Tables 3 and 4.

| | | |
|---|---|---|
| (1) | 1,2,4-Tri(2-hydroxy-3-acryloxypropyloxy)-3-acryloxy-5,6-dihydroxyhexane | 8 wt. pts. |
| (2) | Product of 1 mol of 1,2,4-tri(2-hydroxy-3-acryloxypropyloxy)-3-acryloxy-5,6-dihydroxy-hexane and 1 mol of ethyltriacetoxysilane | 4 wt. pts. |
| (3) | Product of 1 mol of p-xylylenediamine; 3 mols of glycidyl methacrylate and 1 mol of methyl glycidyl ether | 14 wt. pts. |
| (4) | SAMPRENE IB1700D (polyurethane resin of Sanyo Chemical Industry) | 51 wt. pts. |
| (5) | Pentaerythritol tetramethacrylate | 8 wt. pts. |
| (6) | 4,4'-(Diethylamino)benzophenone | 6 wt. pts. |
| (7) | 2-Chlorothioxanthone | 5.6 wt. pts. |
| (8) | Victoria Pure Blue B—OH benzenesulfonate | 0.3 wt. pts. |
| (9) | MCF 323 (surfactant of Dai-Nippon Ink Chemical Industry) | 0.1 wt. pts. |
| (10) | Phosphorus compound No. 3 | 3 wt. pts. |
| (11) | N,N-dimethylformamide | 150 wt. pts. |
| (12) | Methyl isobutyl ketone | 150 wt. pts. |

TABLE 1

| | Image Reproducibility (%) | Image Reproducibility (after stored) (%) | Printing Durability (number of copies, × 10,000) |
|---|---|---|---|
| Example 1 | 2 to 98 | 4 to 96 | 36 |
| Example 2 | 2 to 98 | 4 to 96 | 36 |
| Example 3 | 2 to 98 | 5 to 95 | 40 |
| Comparative Example 1 | 2 to 98 | 10 to 90 | 6 |
| Comparative Example 2 | 3 to 97 | 15 to 85 | 33 |
| Comparative Example 3 | 3 to 97 | 6 to 94 | 20 |
| Example 4 | 2 to 98 | 2 to 98 | 39 |
| Example 5 | 2 to 98 | 2 to 98 | 34 |

TABLE 2

| | Fresh Plates | | | Plates Stored at 50° C. | | |
|---|---|---|---|---|---|---|
| | Image Reproducibility at room temperature (%) | Image Reproducibility at low temperature (%) | Printing Durability (number of copies, ×10,000) | Image Reproducibility at room temperature (%) | Image Reproducibility at low temperature (%) | Printing Durability (number of copies, ×10,000) |
| Example 6 | 2 to 98 | 3 to 97 | 36 | 4 to 96 | 4 to 96 | 36 |
| Example 7 | 2 to 98 | 3 to 97 | 36 | 4 to 96 | 4 to 96 | 36 |
| Example 8 | 2 to 98 | 3 to 97 | 40 | 5 to 95 | 5 to 95 | 40 |
| Comparative Example 4 | 2 to 98 | 15 to 85 | 6 | 10 to 90 | 20 to 80 | 5 |
| Comparative Example 5 | 3 to 97 | 15 to 85 | 33 | 15 to 85 | 25 to 75 | 33 |
| Comparative Example 6 | 2 to 98 | 3 to 97 | 6 | 10 to 90 | 12 to 88 | 5 |
| Example 9 | 2 to 98 | 3 to 97 | 39 | 4 to 96 | 4 to 96 | 38 |
| Example 10 | 2 to 98 | 3 to 97 | 34 | 2 to 98 | 4 to 96 | 34 |
| Example 11 | 2 to 98 | 2 to 98 | 38 | 3 to 97 | 3 to 97 | 38 |
| Example 12 | 2 to 98 | 2 to 98 | 42 | 4 to 96 | 4 to 96 | 41 |
| Example 13 | 2 to 98 | 2 to 98 | 38 | 3 to 97 | 3 to 97 | 38 |

TABLE 3

| | Fresh Plates | | | |
|---|---|---|---|---|
| | Image Reproducibility at room temperature (%) | Image Reproducibility at low temperature (%) | Image Reproducibility after exposure to light (%) | Printing Durability (number of copies, ×10,000) |
| Example 14 | 2 to 98 | 3 to 97 | 3 to 97 | 36 |
| Example 15 | 2 to 98 | 3 to 97 | 3 to 97 | 36 |
| Example 16 | 2 to 98 | 3 to 97 | 3 to 97 | 40 |
| Example 17 | 2 to 98 | 3 to 97 | 3 to 97 | 36 |
| Example 18 | 3 to 97 | 4 to 96 | 4 to 96 | 36 |
| Comparative Example 7 | 2 to 98 | 15 to 85 | 3 to 97 | 6 |
| Comparative Example 8 | 3 to 97 | 15 to 85 | 4 to 96 | 33 |
| Comparative Example 9 | 2 to 98 | 3 to 97 | 3 to 97 | 6 |
| Example 19 | 2 to 98 | 3 to 97 | 3 to 97 | 39 |
| Example 20 | 2 to 98 | 3 to 97 | 3 to 97 | 34 |
| Example 21 | 2 to 98 | 2 to 98 | 3 to 97 | 38 |
| Example 22 | 2 to 98 | 2 to 98 | 3 to 97 | 42 |
| Example 23 | 2 to 98 | 2 to 98 | 3 to 97 | 38 |

TABLE 4

| | Plates Stored at 50° C. | | | |
|---|---|---|---|---|
| | Image Reproducibility at room temperature (%) | Image Reproducibility at low temperature (%) | Image Reproducibility after exposure to light (%) | Printing Durability (number of copies, ×10,000) |
| Example 14 | 4 to 96 | 4 to 96 | 4 to 96 | 36 |
| Example 15 | 4 to 96 | 4 to 96 | 4 to 96 | 36 |
| Example 16 | 5 to 95 | 5 to 95 | 5 to 95 | 40 |
| Example 17 | 4 to 96 | 4 to 96 | 4 to 96 | 36 |
| Example 18 | 5 to 95 | 5 to 95 | 5 to 95 | 36 |
| Comparative Example 7 | 10 to 90 | 20 to 80 | 11 to 89 | 5 |
| Comparative Example 8 | 15 to 85 | 25 to 75 | 16 to 84 | 33 |
| Comparative Example 9 | 10 to 90 | 12 to 88 | 11 to 89 | 5 |
| Example 19 | 4 to 96 | 4 to 96 | 4 to 96 | 38 |
| Example 20 | 2 to 98 | 4 to 96 | 3 to 97 | 34 |
| Example 21 | 3 to 97 | 3 to 97 | 3 to 97 | 38 |
| Example 22 | 4 to 96 | 4 to 96 | 4 to 96 | 41 |
| Example 23 | 3 to 97 | 3 to 97 | 3 to 97 | 38 |

INDUSTRIAL APPLICABILITY

The non-processed plate for waterless lithographic printing plates of the invention contains a photo-polymerizable compound having a specific structure (e.g., reaction product of hexitol-polyglycidyl ether with acrylic acid and/or methacrylic acid) in the photosensitive layer. In this plate, therefore, the adhesion of the photosensitive layer to the overlying ink-repellent layer and to the underlying support or primer layer is good. The plate has good image reproducibility and good storage stability, and the printing plates as obtained by processing this have high printing durability. Further adding a specific phosphorus compound to the photosensitive layer much improves the image reproducibility of the plate in low-temperature exposure. Adding a photo-fading substance or a photo-coloring substance to the protective layer of the plate prevents the plate from being deteriorated in exposure. The plate can be processed in any working environment all the time to give good waterless lithographic printing plates having good printing capabilities.

What is claimed is:

1. A non-processed plate for waterless lithographic printing plates comprising at least a photosensitive layer and an ink-repellent layer as laminated in that order to support, wherein said photosensitive layer contains a compound (A) having a structure of the following chemical formula (I-1):

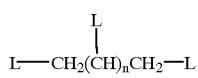

(I-1)

wherein n represents an integer of from 2 to 5; functional groups L may be the same or different, and represent at least one functional group selected from the group consisting of a hydroxyl group, a glycidyloxyl group, an acryloxy group, a methacryloxy group, a 2-hydroxy-2-acryloxypropyloxy group and a 2-hydroxy-3-methacryloxypropyloxy group, wherein at least one L is selected from the group consisting of a 2-hydroxy-3-acryloxypropyloxy group and a 2-hydroxy-3-methacryloxypropyloxy group.

2. The non-processed plate for waterless lithographic printing plates as claimed in claim 1, wherein the compound (A) is one represented by the following chemical formula (I-2):

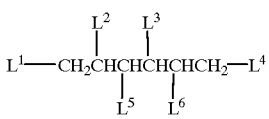

(I-2)

wherein $L^1$ to $L^6$ represent at least one functional group selected from the group consisting of a hydroxyl group, a glycidyloxy group, an acryloxy group, a methacryloxy group, a 2-hydroxy-3-acryloxypropyloxy group-, and a 2-hydroxy-3-methacryloxypropyloxy group, and may be the same or different, provided that at least one of the $L^1$ to $L^6$ is selected from the group consisting of a 2-hydroxy-3-acryloxypropyloxy group and a 2-hydroxy-3-methacryloxypropyloxy group.

3. The non-processed plate for waterless lithographic printing plates as claimed in claim 1, wherein the photosensitive layer contains a compound having a structure of the following chemical formula (II):

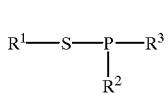

(II)

wherein $R^1$ to $R^3$ are each independently selected from the group consisting of a hydrogen atom, a substituted or unsubstituted alkyl group having from 1 to 50 carbon atoms, a substituted or unsubstituted alkenyl group having from 2 to 50 carbon atoms, and a substituted or unsubstituted aryl group having from 4 to 50 carbon atoms, which have a chemical bond selected from the group consisting of a single bond, an ether bond, a thioether bond, an amino bond, an oxo bond, an ester bond, an amino bond, a carbonate bond, a urethane bond and a urea bond in their chains.

4. The non-processed plate for waterless lithographic printing plates as claimed in claim 3, wherein the compound having the structure of formula (II) is one having a structure of the following chemical formula (III):

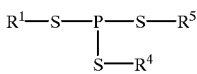

(III)

wherein $R^1$ has the same meaning as in formula (II); $R^4$ and $R^5$ each independently represent at least one functional group selected from the group consisting of a hydrogen atom, a substituted or unsubstituted alkyl group having from 1 to 50 carbon atoms, a substituted or unsubstituted alkenyl group having from 2 to 50 carbon atoms, and a substituted or unsubstituted aryl group having from 4 to 50 carbon atoms, which have a chemical bond selected from the group comprising a single bond, an ether bond, a thioether bond, an amino bond, an oxo bond, an ester bond, an amino bond, a carbonate bond, a urethane bond and a urea bond in their chains.

5. The non-processed plate for waterless lithographic printing plates as claimed in claim 1, wherein the compound (A) is one obtained by reacting hexitol-polyglycidyl ether with acrylic acid and/or methacrylic acid.

6. The non-processed plate for waterless lithographic printing plates as claimed in claim 5, wherein hexitol-polyglycidyl ether is one obtained by reacting 1 mol of hexitol with from 1 to 6 mols of epihalohydrin.

7. The non-processed plate for waterless lithographic printing plates as claimed in claim 1, wherein the compound (A) is one obtained by reacting 1 mol of hexitol with from 1 to 6 mols of epihalohydrin and further with from 3 to 4 mols of acrylic acid and/or methacrylic acid.

8. The non-processed plate for waterless lithographic printing plates as claimed in claim 1, wherein the compound (A) is one obtained by reacting 1 mol of hexitol with from 3 to 4 mols of epihalohydrin and further with from 1 to 6 mols of acrylic acid and/or methacrylic acid.

9. The non-processed plate for waterless lithographic printing plates as claimed in claim 1, wherein the compound (A) is one obtained by reacting 1 mol of hexitol with from 3 to 4 mols of epihalohydrin and further with from 3 to 4 mols of acrylic acid and/or methacrylic acid.

10. The non-processed plate for waterless lithographic printing plates as claimed in claim 6 to 9, wherein hexitol is sorbitol.

11. The non-processed plate for waterless lithographic printing plates as claimed in claim 1, wherein the photosensitive layer contains a binder polymer.

12. The non-processed plate for waterless lithographic printing plates as claimed in claim 11, wherein the ratio of the compound (A) to the binder polymer is from 100/10 to 100/8,000 by weight.

13. The non-processed plate for waterless lithographic printing plates as claimed in claim 1, wherein the photosensitive layer contains an amino group-having monomer.

14. The non-processed plate for waterless lithographic printing plates as claimed in claim 1, wherein a protective layer is further laminated over the ink-repellent layer.

15. The non-processed plate for waterless lithographic printing plates as claimed in claim 14, wherein the protective layer contains a photo-fading substance.

16. The non-processed plate for waterless lithographic printing plates of as claimed in claim 15, wherein the photo-fading substance in the protective layer is at least one of disperse dyes, cationic dyes, reactive dyes, quinonediazide compounds and diazo compounds.

17. The non-processed plate for waterless lithographic printing plates as claimed in claim 14, wherein the protective layer contains a photo-coloring substance.

18. The non-processed plate for waterless lithographic printing plates as claimed in claim 17, wherein the photo-coloring substance in the protective layer is a photochromic compound.

19. The non-processed plate for waterless lithographic printing plates as claimed in claim 14 to 18, wherein the protective layer contains grains having, as measured in the Coulter counter method, a mean grain size of from 4 to $9\mu$ and a refractive index of from 1.4 to 1.7.

20. The non-processed plate for waterless lithographic printing plates as claimed in claim 1, wherein the ink-repellent layer is a silicone rubber layer.

21. The non-processed plate for waterless lithographic printing plates as claimed in claim 20, wherein the ink-repellent layer comprises silicone rubber as obtained through condensation reaction.

22. The non-processed plate for waterless lithographic printing plates as claimed in claim 20, wherein the ink-repellent layer comprises silicone rubber as obtained through addition reaction.

23. The non-processed plate for waterless lithographic printing plates as claimed in claim 1, wherein a primer layer is interposed between the support and the photosensitive layer.

24. A method for producing a waterless lithographic printing plate, comprising exposing and developing the non-processed plate of claim 1.

* * * * *

UNITED STATES PATENT AND TRADEMARK OFFICE
CERTIFICATE OF CORRECTION

PATENT NO. : 6,106,997
DATED : August 22, 2000
INVENTOR(S) : Oguni et al

It is certified that error appears in the above-identified patent and that said Letters Patent is hereby corrected as shown below:

In Column 10, at approximately line 42, please change "1,213,4-tetra (2-" to --1,2,3,4-tetra(2- --.

In Column 29, at approximately line 36, please change "1,6" to --1,8--.

In Column 35, at approximately line 56, after "Tables 3 and" please insert --4.--.

Signed and Sealed this

Twenty-ninth Day of May, 2001

*Attest:*

NICHOLAS P. GODICI

*Attesting Officer*     *Acting Director of the United States Patent and Trademark Office*